United States Patent [19]
Yakou et al.

[11] Patent Number: 5,735,967
[45] Date of Patent: Apr. 7, 1998

[54] METHOD FOR DISPOSING LINEAR BODY AND SOLAR CELL OBTAINED THEREBY

[75] Inventors: Takeshi Yakou, Tokyo; Tsunenobu Satoi, Yokohama; Eiji Takaki, Ibaraki-ken; Toshio Akiyama, Yokohama, all of Japan

[73] Assignee: Canon Kabushiki Kaisha, Tokyo, Japan

[21] Appl. No.: 675,830

[22] Filed: Jul. 5, 1996

[30] Foreign Application Priority Data

| Jul. 11, 1995 | [JP] | Japan | 7-174824 |
| Jul. 11, 1995 | [JP] | Japan | 7-174825 |
| Jul. 11, 1995 | [JP] | Japan | 7-174826 |
| Jul. 11, 1995 | [JP] | Japan | 7-174827 |
| Feb. 21, 1996 | [JP] | Japan | 8-033621 |
| Jun. 14, 1996 | [JP] | Japan | 8-154116 |

[51] Int. Cl.$^6$ ................ H01L 31/04; H01L 31/18; H01L 31/0224

[52] U.S. Cl. ................ 136/256; 29/850; 29/868; 257/459; 438/98; 156/47; 156/166; 156/167; 156/250; 156/267

[58] Field of Search ................ 437/2-5, 180; 156/47, 166-167, 250, 267; 29/850, 868; 136/256; 257/459; 438/98

[56] References Cited

U.S. PATENT DOCUMENTS

| 4,348,546 | 9/1982 | Little | 136/256 |
| 5,084,107 | 1/1992 | Deguchi et al. | 136/256 |
| 5,151,373 | 9/1992 | Deguchi et al. | 437/2 |

FOREIGN PATENT DOCUMENTS

| 3-6867 | 1/1991 | Japan | 136/256 |

*Primary Examiner*—Aaron Weisstuch
*Attorney, Agent, or Firm*—Fitzpatrick, Cella, Harper & Scinto

[57] ABSTRACT

A linear body disposing method capable of extending a large number of wires above a work efficiently provides a plurality of collector wires on a substrate coated with a photosensitive film. The plurality of collector wires are held at a predetermined interval therebetween before one end of the substrate. The plurality of held collector wires are drawn to the other end of the substrate simultaneously. The other end of each of said drawn collector wires is fixed on the substrate. Subsequently, while the collector wires are held at the one end of the substrate, one end of each of the collector wires is fixed to the one end of the substrate. Thereafter, the collector wires are cut.

27 Claims, 34 Drawing Sheets

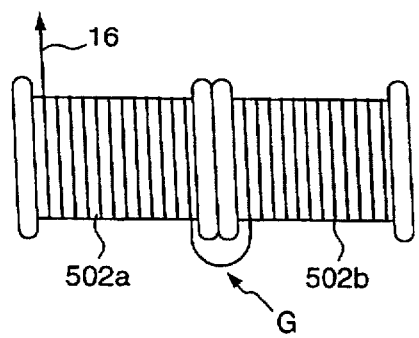
FIG. 15A
BEFORE FIRST USE
(WHEN CASSETTE IS SET)
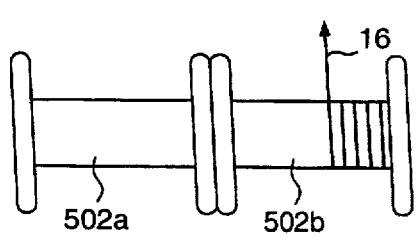
FIG. 15B
AFTER FIRST USE
FIG. 15C
BEFORE SECOND USE
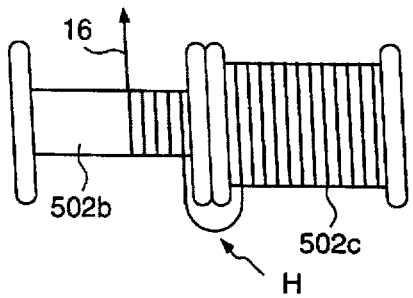
FIG. 15D
AFTER SECOND USE
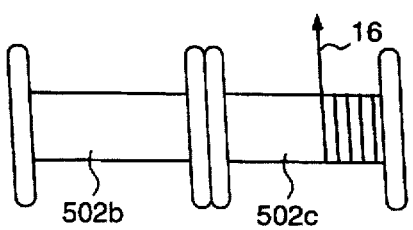
FIG. 15E
BEFORE THIRD USE
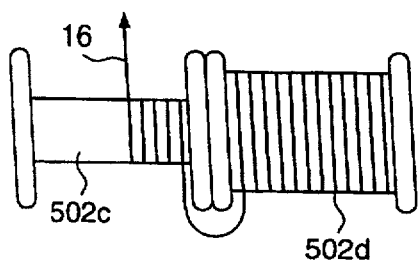

16 FORTY-TWO WIRES

F I G. 22
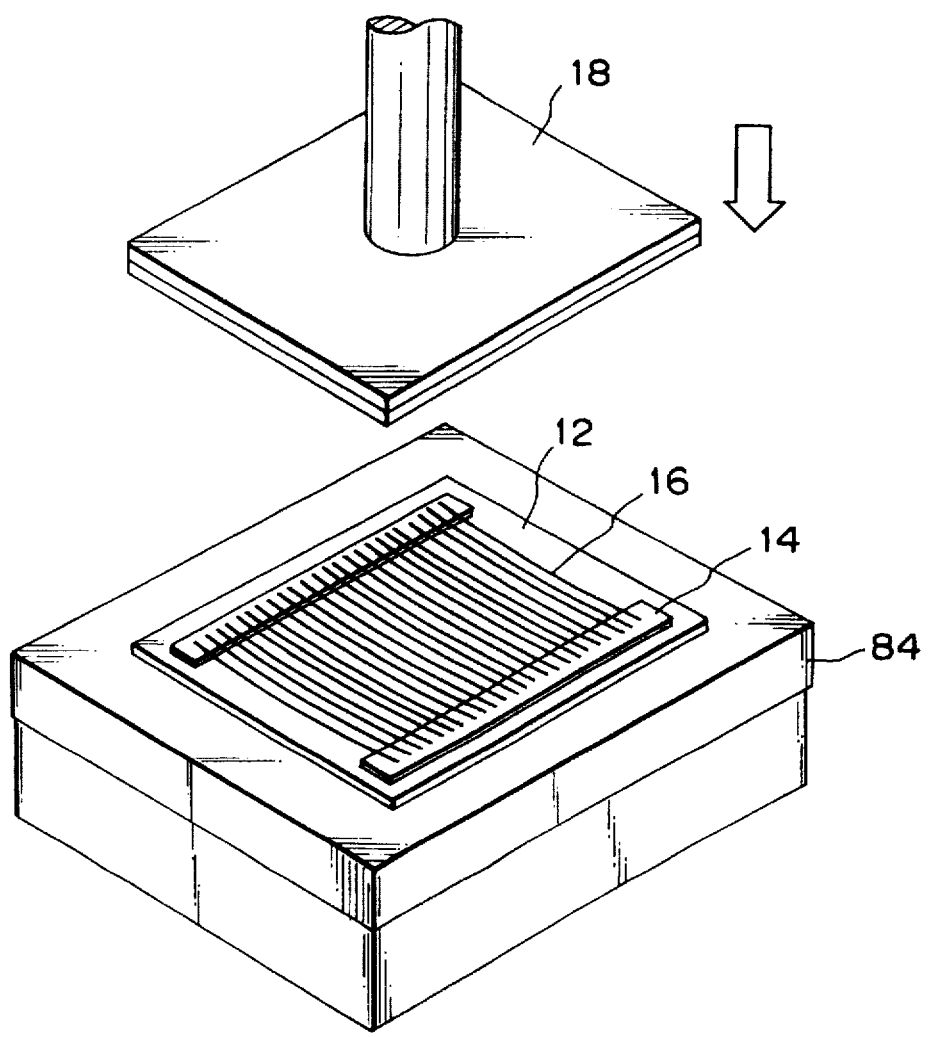

POINT L

ADHESIVE

METHOD FOR DISPOSING LINEAR BODY AND SOLAR CELL OBTAINED THEREBY

BACKGROUND OF THE INVENTION

The present invention relates to a method and apparatus for disposing a linear body on a predetermined workpiece in the manufacture of e.g., a solar cell.

A wire collector scheme is conventionally known as one scheme for the current collector structure of a solar cell. In the manufacture of the solar cell wire collector scheme, a large number of collector wires must be positioned parallel to each other on a substrate on which a photosemiconductor film is formed. For this reason, in a manufacturing apparatus for manufacturing a solar cell of the wire collector type, a method is adopted in which a large number of bobbins on which wires are wound independently of each other are arranged. The wires are drawn from these large number of bobbins and extended above the substrate serving as the workpiece.

In this method, the wires are respectively drawn from the large number of bobbins and sequentially extended above the substrate. Thus, since it takes time to extend all of the large number of wires, it leads to poor productivity.

Also in this method, the wires are occasionally found to be discontinuous. If the operator continues the manufacturing process without noticing that the wires have been become discontinuous, a large number of defective products are manufactured. Even if the operator notices a discontinuity, a very cumbersome restoration operation is needed for the discontinuous wire.

In the above method, when one of the large number of bobbins becomes empty, the manufacturing process cannot be continued unless the empty bobbin is exchanged. In particular, since the lengths of wires respectively wound on the large number of bobbins may vary, when one bobbin becomes empty, the wires on the remaining bobbins will also become short. Even if the empty bobbin is exchanged for a new one, another bobbin will become empty soon, leading to the necessity of exchanging bobbins frequently. During bobbin exchange, the manufacturing apparatus must be stopped. When the bobbins have to be exchanged frequently in this manner, the manufacturing efficiency is decreased greatly.

In order to solve this problem, when one bobbin becomes empty, the remaining bobbins which have not become empty may also be exchanged. In this case, however, all the wires remaining on the bobbins that are not yet empty will be wasted and cause the process to be uneconomical.

SUMMARY OF THE INVENTION

The present invention has been made in view of the above problems, and has as its object to provide a linear body disposing method and apparatus capable of extending a large number of linear bodies above a workpiece efficiently.

It is another object of the present invention to provide a linear body gripping mechanism of a linear body disposing apparatus capable of efficiently extending a large number of linear bodies above a workpiece.

It is still another object of the present invention to provide a linear body discontinuity detecting unit and method in a linear body disposing apparatus capable of quickly detecting discontinuity of the linear body.

It is still another object of the present invention to provide a continuity restoring method in a linear body disposing apparatus capable of easily restoring continuity of a discontinuous linear body.

It is still another object of the present invention to provide a linear body cutting mechanism and method in a linear body disposing apparatus capable of efficiently extending a large number of linear bodies above a workpiece.

It is still another object of the present invention to provide a bobbin exchanging method in a linear body disposing apparatus capable of preventing a decrease in manufacturing efficiency and eliminating waste of the linear body.

In order to solve the problems described above and to achieve the above objects, the first aspect of the linear body disposing method of the present invention has the following steps.

More specifically, there is provided a linear body disposing method for providing a plurality of collector wires on a substrate coated with a photosensitive film, comprising holding the plurality of collector wires at a predetermined interval therebetween before one end of the substrate, simultaneously drawing the plurality of collector wires to the other end of the substrate, fixing the other end of each of the collector wires drawn over the substrate, and subsequently, while the collector wires are held at one end of the substrate, fixing one end of each of the collector wires to one end of the substrate, and thereafter cutting the collector wires.

The second aspect of the linear body disposing method of the present invention has the following steps.

More specifically, there is provided a linear body disposing method for providing a plurality of collector wires on a solar cell substrate, comprising a step of extracting the plurality of collector wires from a wire storing portion so as to be aligned with each other, a step of holding the collector wires and drawing the collector wires from one end to the other end of the substrate at a predetermined spacing between adjacent wires, a step of removing slack in the drawn collector wires, a step of applying tension to the collector wires after the slack is removed, and a step of cutting the collector wires after the tension is applied thereto.

The first aspect of the linear body disposing apparatus of the present invention has the following arrangement.

More specifically, there is provided a linear body disposing apparatus for providing a plurality of collector wires on a solar cell substrate, comprising wire storing means for supplying the collector wires at a plurality of spacings, drawing means for drawing the plurality of collector wires to a terminal end of the substrate while maintaining the spacings, first fixing means for fixing the wires drawn to the terminal end of the substrate, and second fixing means for fixing the wires at an initial end of the substrate.

A solar cell according to the present invention has the following arrangement.

More specifically, there is provided a solar cell manufactured by employing a linear body disposing method of providing a plurality of collector wires on a substrate with a photosensitive film, wherein a plurality of collector wires are held at a predetermined interval therebetween before one end of the substrate, the plurality of collector wires are simultaneously drawn to the other end of the substrate, the other end of each of the drawn collector wires is fixed on the substrate, and subsequently, while the collector wires are held at one end of the substrate, one end of each of the collector wires is fixed to one end of the substrate, and thereafter the collector wires are cut, thereby manufacturing the solar cell substrate.

The third aspect of the linear body disposing method of the present invention has the following steps.

More specifically, there is provided a linear body disposing method of extending a predetermined number of parallel wires above a predetermined workpiece, comprising a first step of unwinding the predetermined number of wires from bobbins, on which the predetermined number of wires are wound independently of each other, so as to be parallel to each other and gripping each of the predetermined number of wires with gripping means, a second step of drawing the predetermined number of wires that are gripped in the first step from a first end portion to a second end portion of the workpiece, the third step of urging leading end portions of the predetermined number of wires against the second end portion of the work to adhere the leading end portions of the predetermined number of wires to the second end portion of the workpiece, a fourth step of releasing the leading end portions of the gripped wires and moving the gripping means backward in a direction opposite to the direction in which the predetermined number of wires have been drawn, a fifth step of urging trailing portions of the predetermined number of wires against the first end portion of the work to adhere the trailing portions of the predetermined number of wires to the first end portion, and a sixth step of cutting each of the trailing portions of the predetermined number of wires before the first end portion.

A wire gripping mechanism in a linear body disposing apparatus according to the present invention has the following arrangement.

More specifically, there is provided a wire gripping mechanism in a linear body disposing apparatus for extending a predetermined number of parallel spaced apart wires above a predetermined workpiece, comprising a gripping mechanism body, a plurality of stationary fingers fixed to the gripping mechanism body at the same spacing at which the predetermined number of wires are arranged, a plurality of movable fingers pivotally supported by the gripping mechanism body at centers thereof to oppose the plurality of stationary fingers, each of the plurality of movable fingers having a gripping portion at one end portion thereof to grip a corresponding wire together with a corresponding stationary finger and an engaging portion at the other end portion thereof to engage with another member, a movable member movable with respect to the gripping mechanism body, a plurality of elastic members each having one end portion fixed to the movable member and the other end portion engaging with the engaging portion of a corresponding movable finger, and a driving source for moving the movable member relative to the gripping mechanism body.

A wire discontinuity detecting unit in a linear body disposing apparatus according to the present invention has the following arrangement.

More specifically, there is provided a wire discontinuity detecting unit in a linear body disposing apparatus that extends a wire above a predetermined workpiece, comprising a main body of a guide mechanism for guiding the wire, a pivotal member provided to the main body to be pivotal in a vertical direction, a guide member provided to a distal end portion of the pivotal member to guide the wire, and detection means for detecting a pivotal movement of a distal end of the pivotal member when the wire becomes discontinuous and the distal end of the pivotal member is pivoted downward due to the weight thereof.

A wire discontinuity detecting method in a linear body disposing apparatus has the following steps.

More specifically, there is provided a wire discontinuity detecting method in a linear body disposing apparatus for extending a wire above a predetermined workpiece, comprising supporting a pivotal member on a main body of a guide mechanism that guides the wire, so as to be pivotal in a vertical direction, the pivotal member comprising a guide member that guides the wire at a substantially distal end portion thereof, and when the wire becomes discontinuous and a distal end of the pivotal member is pivoted downward due to the weight thereof, detecting a pivotal movement of the pivotal member, thereby detecting a discontinuity of the wire.

A wire continuity restoring method in a linear body disposing apparatus has the following steps.

More specifically, there is provided a wire continuity restoring method in a linear body disposing apparatus which comprises a gripper for drawing the wire from a bobbin wound with the wire in order to extend the wire above a predetermined workpiece, guide means for guiding the wire, and urging means for urging the wire on the workpiece, comprising a step of detecting discontinuity of the wire, a step of cutting and discarding portions of the wire which are before and after a discontinuous wire portion, a step of retracting the gripper, the guide means, and the urging means upward, a step of drawing, by gripping with a restoring gripper, the wire from the bobbin when the gripper, the guide means, and the urging means are retracted, the gripping means restoring the gripper to an initial position and gripping the wire which has been drawn in the drawing step with the gripper, and a step of restoring the guide means and the urging means to initial positions.

A wire cutting mechanism in a linear body disposing apparatus according to the present invention has the following arrangement.

More specifically, there is provided a wire cutting mechanism in a linear body disposing apparatus for extending a predetermined number of wires above a predetermined workpiece so as to be parallel to each other, comprising a cutting mechanism body formed with a plurality of stationary blades at the same spacing as that at which the predetermined number of wires are arranged, each of the plurality of stationary blades having a width smaller than this spacing, a slide member slidably provided to the cutting mechanism body and formed with a plurality of movable blades at the same spacing as that at which the wires are arranged, each of the plurality of movable blades having a width smaller than the spacing thereof, a shift mechanism for shifting the cutting mechanism body to a position where the stationary blades come into contact with the wires after the stationary blades and the movable blades are inserted among the predetermined number of wires so as not to contact the wires, and driving means for sliding the slide member with respect to the cutting mechanism body, thereby cutting the wires.

A wire cutting method in a linear body disposing apparatus according to the present invention has the following steps.

More specifically, there is provided a wire cutting method in a linear body disposing apparatus for extending a predetermined number of wires above a predetermined workpiece so as to be parallel to each other, comprising a step of moving a cutting mechanism formed with a plurality of stationary blades and movable blades to be inserted among the predetermined number of wires so as not to contact the wires, the plurality of stationary blades and movable blades being provided at the same spacing as that at which the predetermined number of wires are arranged and each having a width smaller than the spacing thereof, a step of shifting the cutting mechanism to a position where the stationary blades come into contact with the wires, and a step of sliding the movable blades with respect to the stationary blades, thereby simultaneously cutting each of the predetermined number of wires.

A bobbin exchanging method in a linear body disposing apparatus according to the present invention has the following steps.

More specifically, there is provided a bobbin exchanging method in a linear body disposing apparatus for exchanging bobbins on which the predetermined number of wires are wound, the linear body disposing apparatus serving to extend the predetermined number of wires above a predetermined workpiece so as to be parallel to each other, comprising a first step of mounting two new bobbins wound with the wires thereon on a predetermined number of bobbin shafts that rotatably support the bobbins, and a second step of, when the two bobbins mounted on any one of the predetermined number of bobbin shafts become empty, mounting two new bobbins on the one bobbin shaft, and exchanging, of first and second bobbins mounted on another bobbin shaft, the first bobbin which has become empty for a new third bobbin.

The fourth aspect of the linear body disposing method of the present invention has the following steps.

More specifically, there is provided a linear body disposing method of disposing a plurality of linear bodies on a predetermined workpiece so as to be parallel to each other, comprising a step of removing the plurality of linear bodies from a storage portion that stores the linear bodies so as to be arranged parallel to each other, a first gripping step of simultaneously gripping with gripping means each of the plurality of linear bodies arranged parallel to each other at portions thereof which are in the vicinity of leading end portions thereof, a step of drawing the plurality of wires gripped in the first gripping step from a first end portion to a second end portion of the workpiece, a step of temporarily fixing the plurality of linear bodies, drawn in the drawing step, at portions thereof which are in the vicinity of the leading end portions, with urging means against a portion of the workpiece which is in the vicinity of the second end portion thereof, a step of releasing the gripping state of the gripping means and returning the gripping means to the first end portion of the workpiece, a second gripping step of again gripping with the gripping means portions of the linear bodies located at the first end portion of the workpiece, a step of thermally contact-bonding the plurality of linear bodies onto the workpiece with contact bonding means while maintaining the plurality of linear bodies gripped in the second gripping step, a step of cutting the plurality of linear bodies at the first end portion of the workpiece, the cutting step being performed parallel to the contact bonding step, and a step of releasing the contact bonding state created by the contact bonding means and the temporary fixing state created by the urging means.

The fifth aspect of the linear body disposing method of the present invention has the following steps.

More specifically, there is provided a linear body disposing method of disposing a plurality of linear bodies on a predetermined workpiece so as to be parallel to each other, comprising a step of removing the plurality of linear bodies from a storage portion that stores the linear bodies so as to be arranged parallel to each other, a first gripping step of simultaneously gripping with gripping means the plurality of linear bodies arranged parallel to each other at portions thereof which are in the vicinity of leading end portions thereof, a step of drawing the plurality of wires gripped in the first gripping step from a first end portion of the workpiece to a position beyond a second end portion of the workpiece, a step of thermally contact-bonding portions of the plurality of linear bodies located between a portion in the vicinity of the first end portion and a portion in the vicinity of the second end portion of the work onto the workpiece with contact bonding means, a step of cutting portions of the plurality of linear bodies located at the first and second end portions of the workpiece, the cutting step being performed parallel to the contact bonding step, and the step of releasing the contact bonding state created by the contact bonding means.

The sixth aspect of the linear body disposing method of the present invention has the following steps.

More specifically, there is provided a linear body disposing method for disposing a plurality of linear bodies on a predetermined workpiece so as to be parallel to each other, comprising a step of removing the plurality of linear bodies from a storage portion that stores them so as to be arranged parallel to each other, a first gripping step of simultaneously gripping with gripping means the plurality of linear bodies arranged parallel to each other at portions thereof which are in the vicinity of leading end portions thereof, a step of drawing the plurality of wires gripped in the first gripping step from a first end portion to a second end portion of the workpiece, a step of temporarily fixing the plurality of linear bodies, drawn in the drawing step, at portions thereof which are in the vicinity of the leading end portions thereof, with urging means against a portion of the workpiece which is in the vicinity of the second end portion thereof, the returning step of releasing the gripping state of the gripping means and returning the gripping means to the first end portion of the workpiece, a second gripping step of again gripping portions of the linear bodies located at the first end portion of the work with the gripping means, a step of urging the plurality of linear bodies against the workpiece while maintaining the plurality linear bodies gripped in the second gripping step, and supplying an adhesive to the plurality of linear bodies and the workpiece by adhesive supplying means, thereby adhering together the plurality of linear bodies and the workpiece, a step of cutting the plurality of linear bodies at positions at the first end portion of the workpiece, the cutting step being performed parallel to the adhering step, and a step of separating the adhesive supplying means and the urging means from the workpiece.

The seventh aspect of the linear body disposing method of the present invention has the following steps.

More specifically, there is provided a linear body disposing method of disposing a plurality of linear bodies on a predetermined workpiece so as to be parallel to each other, comprising a step of extracting the plurality of linear bodies from a storage portion that stores the linear bodies so as to be arranged parallel to each other, a first gripping step of simultaneously gripping with gripping means the plurality of linear bodies arranged parallel to each other at portions thereof which are in the vicinity of leading end portions thereof, a step of drawing the plurality of wires gripped in the first gripping step from a first end portion to a second end portion of the workpiece, a step of urging the plurality of linear bodies against the workpiece at portions thereof located between a portion of the workpiece in the vicinity of the first end portion thereof and a portion of the workpiece in the vicinity of the second end portion thereof, and supplying an adhesive to the plurality of linear bodies and the workpiece by adhesive supplying means, thereby adhering together the plurality of linear bodies and the workpiece, a step of cutting portions of the plurality of linear bodies located at the first end and second end portions of the workpiece, the cutting step being performed parallel to the adhering step, and a step of separating the adhesive supplying means and the urging means from the workpiece.

The second aspect of the linear body disposing apparatus of the present invention has the following arrangement.

More specifically, there is provided a linear body disposing apparatus for disposing a plurality of linear bodies on a predetermined workpiece so as to be parallel to each other, comprising linear body storage means for feeding the plurality of linear bodies at a predetermined spacing, gripping means for simultaneously gripping the plurality of linear bodies while maintaining the predetermined spacing therebetween, moving means for moving the gripping means between a portion in the vicinity of a first end portion of the workpiece and a portion in the vicinity of a second end portion of the workpiece, urging means for urging against the portion in the vicinity of the second end portion of the workpiece, portions in the vicinity of leading end portions of the linear bodies gripped by the gripping means and drawn to the portion in the vicinity of the second end portion of the workpiece by the moving means, thereby temporarily fixing the linear bodies, contact bonding means for contact bonding portions of the linear bodies located between the portion in the vicinity of the first end portion of the workpiece and the portion in the vicinity of the second end portion of the workpiece into the workpiece, and cutting means for cutting portions of the linear bodies located in the vicinity of the first end portion of the workpiece.

The third aspect of the linear body disposing apparatus of the present invention has the following arrangement.

More specifically, there is provided a linear body disposing apparatus for disposing a plurality of linear bodies on a predetermined workpiece so as to be parallel to each other, comprising linear body storage means for feeding the plurality of linear bodies at a predetermined spacing, gripping means for simultaneously gripping the plurality of linear bodies while maintaining the predetermined spacing therebetween, moving means for moving the gripping means between a portion in the vicinity of a first end portion of the workpiece and a portion in the vicinity of a second end portion of the workpiece, contact-bonding means for contact-bonding onto the workpiece, portions of the linear bodies gripped by the gripping means and drawn by the moving means to a position beyond the second end portion of the workpiece, the portions of the linear bodies being located between the portion of the workpiece in the vicinity of the first end portion thereof and the portion of the workpiece in the vicinity of the second end portion thereof, and cutting means for cutting portions of the linear bodies located in the vicinity of the first and second end portions of the workpiece.

The fourth aspect of the linear body disposing apparatus of the present invention has the following arrangement.

More specifically, there is provided a linear body disposing apparatus for disposing a plurality of linear bodies on a predetermined workpiece so as to be parallel to each other, comprising a linear body storage means for feeding the plurality of linear bodies at a predetermined spacing, gripping means for simultaneously gripping the plurality of linear bodies while maintaining the predetermined spacing therebetween, moving means for moving the gripping means between a portion in the vicinity of a first end portion of the workpiece and a portion in the vicinity of a second end portion of the workpiece, urging means for urging against the portion in the vicinity of the second end portion of the workpiece, portions in the vicinity of leading end portions of the linear bodies gripped by the gripping means and drawn to the portion in the vicinity of the second end portion of the workpiece by the moving means, thereby temporarily fixing the linear bodies, adhesive supplying means for adhering portions of the linear bodies located between the portion in the vicinity of the first end portion of the workpiece and the portion in the vicinity of the second end portion of the workpiece by supplying an adhesive thereto, and cutting means for cutting portions of the linear bodies located in the vicinity of the first end portion of the workpiece.

The fifth aspect of the linear body disposing apparatus of the present invention has the following arrangement.

More specifically, there is provided a linear body disposing apparatus for disposing a plurality of linear bodies on a predetermined workpiece so as to be parallel to each other, comprising linear body storing means for feeding the plurality of linear bodies at a predetermined spacing, gripping means for simultaneously gripping the plurality of linear bodies while maintaining the predetermined spacing therebetween, moving means for moving the gripping means between a portion in the vicinity of a first end portion of the workpiece and a portion in the vicinity of a second end portion of the workpiece, urging means for urging onto the workpiece, portions of the linear bodies gripped by the gripping means and drawn by the moving means to a position beyond the second end portion of the workpiece, the portions of the linear bodies being located between the portion of the workpiece in the vicinity of the first end portion thereof and the portion of the workpiece in the vicinity of the second end portion thereof, adhesive supplying means for adhering the plurality of linear bodies and the workpiece by supplying an adhesive thereto, and cutting means for cutting portions of the linear bodies located in the vicinity of the first and second end portions of the workpiece.

Other objects and advantages besides those discussed above shall be apparent to those skilled in the art from the description of a preferred embodiment of the invention which follows. In the description, reference is made to the accompanying drawings, which form a part hereof, and which illustrate an example of the invention. Such an example, however, is not exhaustive of the various embodiments of the invention, and therefore reference is made to the claims which follow the description for determining the scope of the invention.

BRIEF DESCRIPTION OF THE DRAWINGS

FIGS. 15A to 15E are views for explaining how to exchange bobbins;

FIG. 22 is a view conceptually showing how collector wires are thermally bonded;

DETAILED DESCRIPTION OF THE PREFERRED EMBODIMENTS

Wiring apparatuses as linear body disposing apparatuses according to the preferred embodiments of the present invention will be described in detail with reference to the accompanying drawings.

First Embodiment

In the first embodiment, the wiring apparatus is applied to the manufacture of a solar cell.

In the manufacture of the solar cell, an Al/ZnO lower reflecting layer, an n/i/p type amorphous silicon semiconductor layer, and an ITO transparent conductive layer, for converting light into electricity are formed on a stainless steel substrate having a thickness of, e.g., about 0.1 mm and a predetermined area. A large number of collector wires for collecting electrical charges generated by the semiconductor film are fixed by thermal bonding or the like on the stainless steel substrate (to be referred to as a slab hereinafter) on which these films have been formed. As the collector wire, a copper wire coated with a conductive film, e.g., a carbon coating, is used. A solar cell of this construction is generally called a solar cell of the wire collector type. As a pre-step to fixing the collector wires by thermal bonding or the like on the slab on which the above films have been formed, the wiring apparatus of this embodiment performs the operation of temporarily fixing the collector wires above the slab with double-coated tape or the like.

Figure 1A:
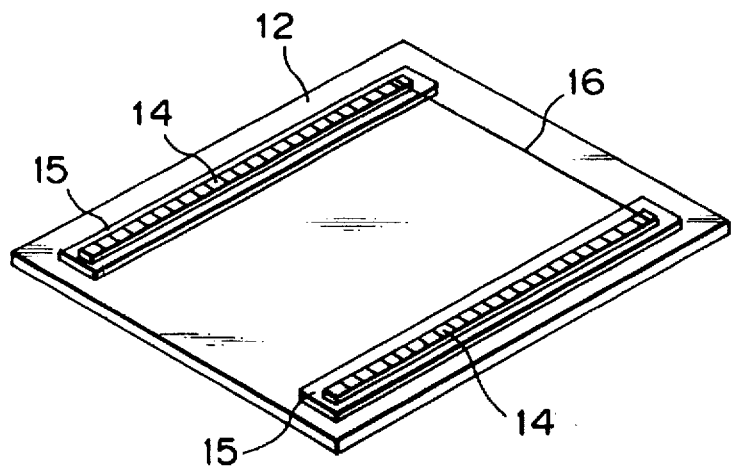
FIG. 1A is a perspective view showing a workpiece.
Figure 1B:
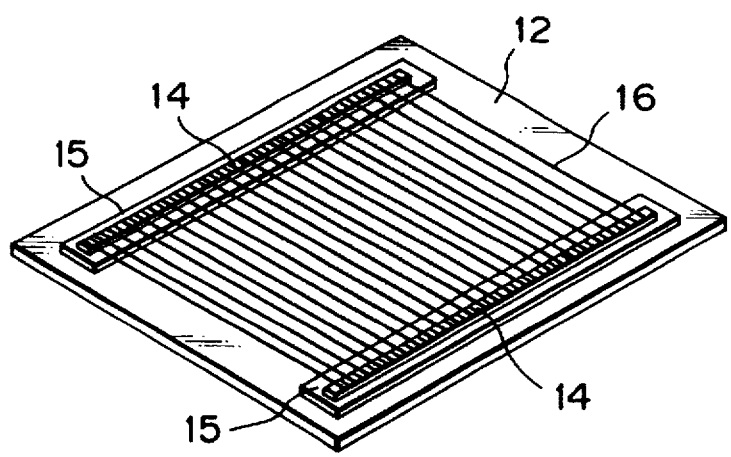
FIG. 1B shows a state wherein collector wires are extended above the workpiece.
Figure 1C:
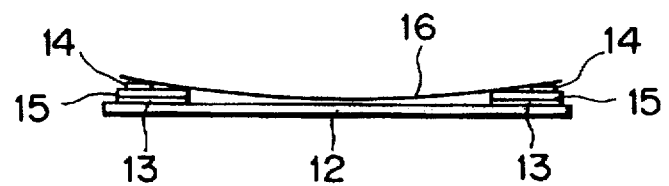
FIG. 1C is a side view of FIG. 1B.

FIG. 1A is a perspective view showing a slab 12 described above. Copper foils 15 serving as collector electrodes are adhered on the two end portions of the square slab 12 with double-coated tape 13 (FIG. 1C), and double-coated tape 14 are adhered on the copper foils 15. Then, collector wires 16 are extended and temporarily fixed between the double-coated tape 14. FIG. 1B shows a state wherein the collector wires 16 are extended above the slab 12 in this manner. FIG. 1C is a side view of FIG. 1B.

Figure 1D:
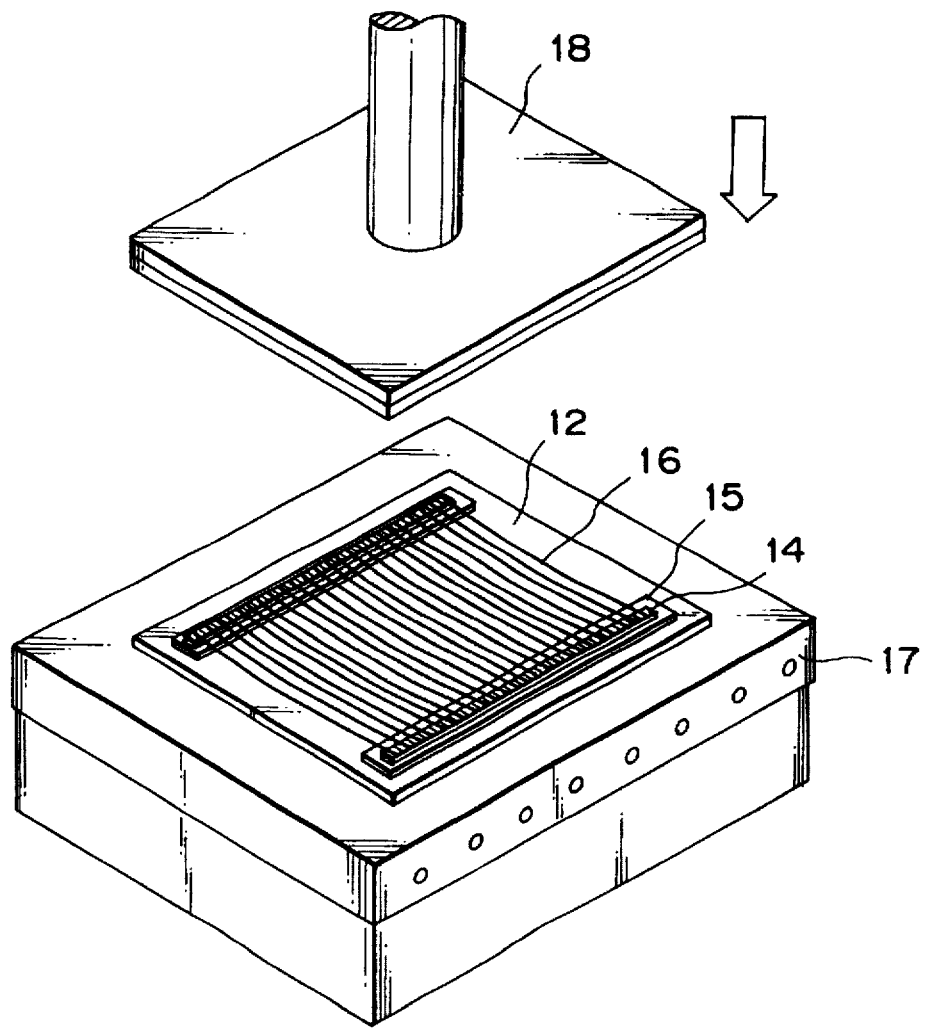
FIG. 1D shows how to fix the collector wires by pressing.

After the collector wires 16 are temporarily fixed on the slab 12 with the double-coated tape 14, as shown in FIGS. 1B and 1C, the slab 12 is placed on heater 17 heated to about 250° C. as shown in FIG. 1D. While being heated, the collector wires 16 that are temporarily fixed are pressed onto the slab 12 by a press 18 for about 5 seconds to melt the conductive resin applied on the collector wires 16, thereby bonding the collector wires 16 to the slab 12. The collector wires 16 are fixed on the slab 12 in this manner.

The arrangement of the wiring apparatus according to this embodiment will be described.

Figure 2:
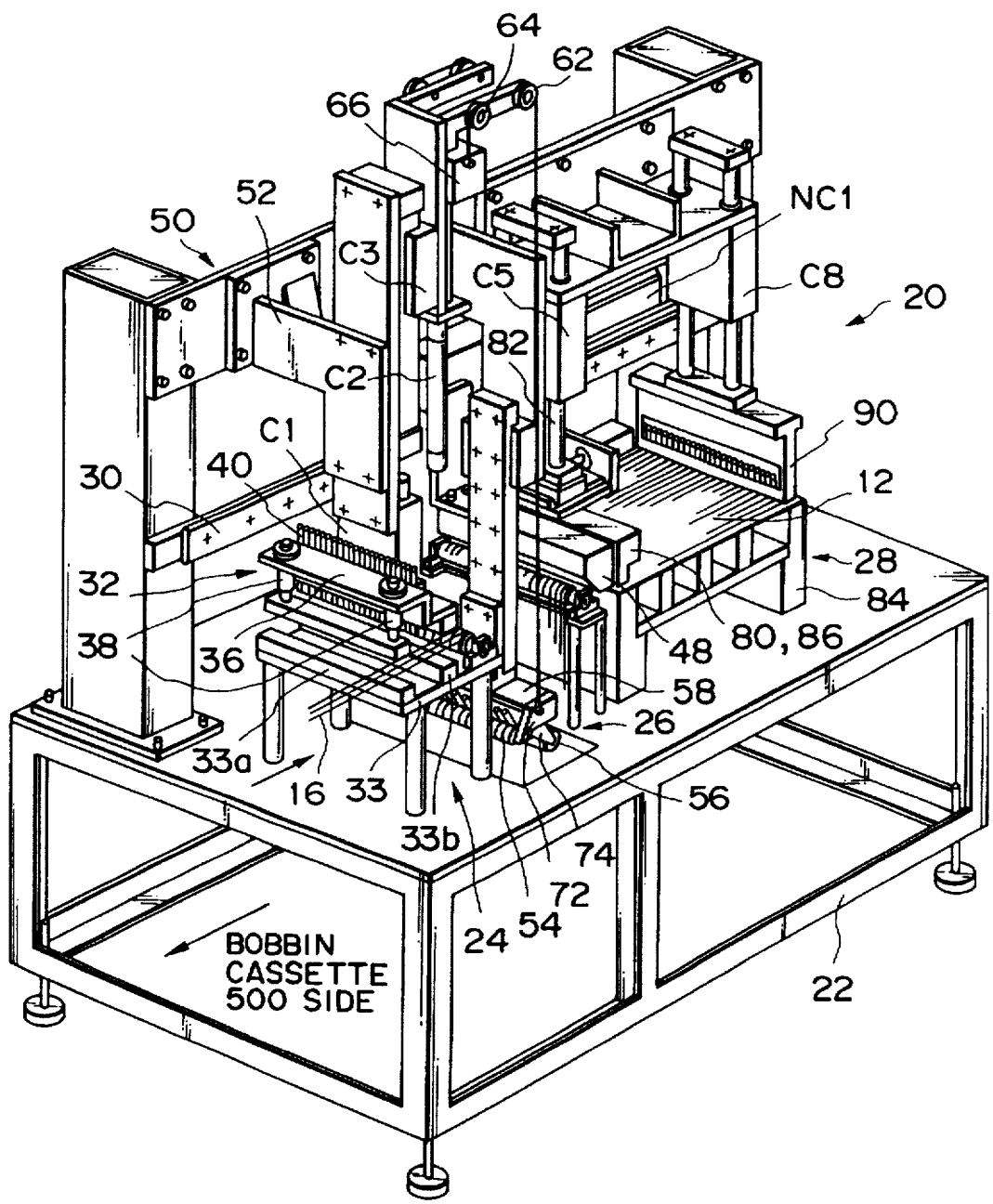
FIG. 2 is a perspective view showing the overall arrangement of a wiring apparatus.
Figure 3:
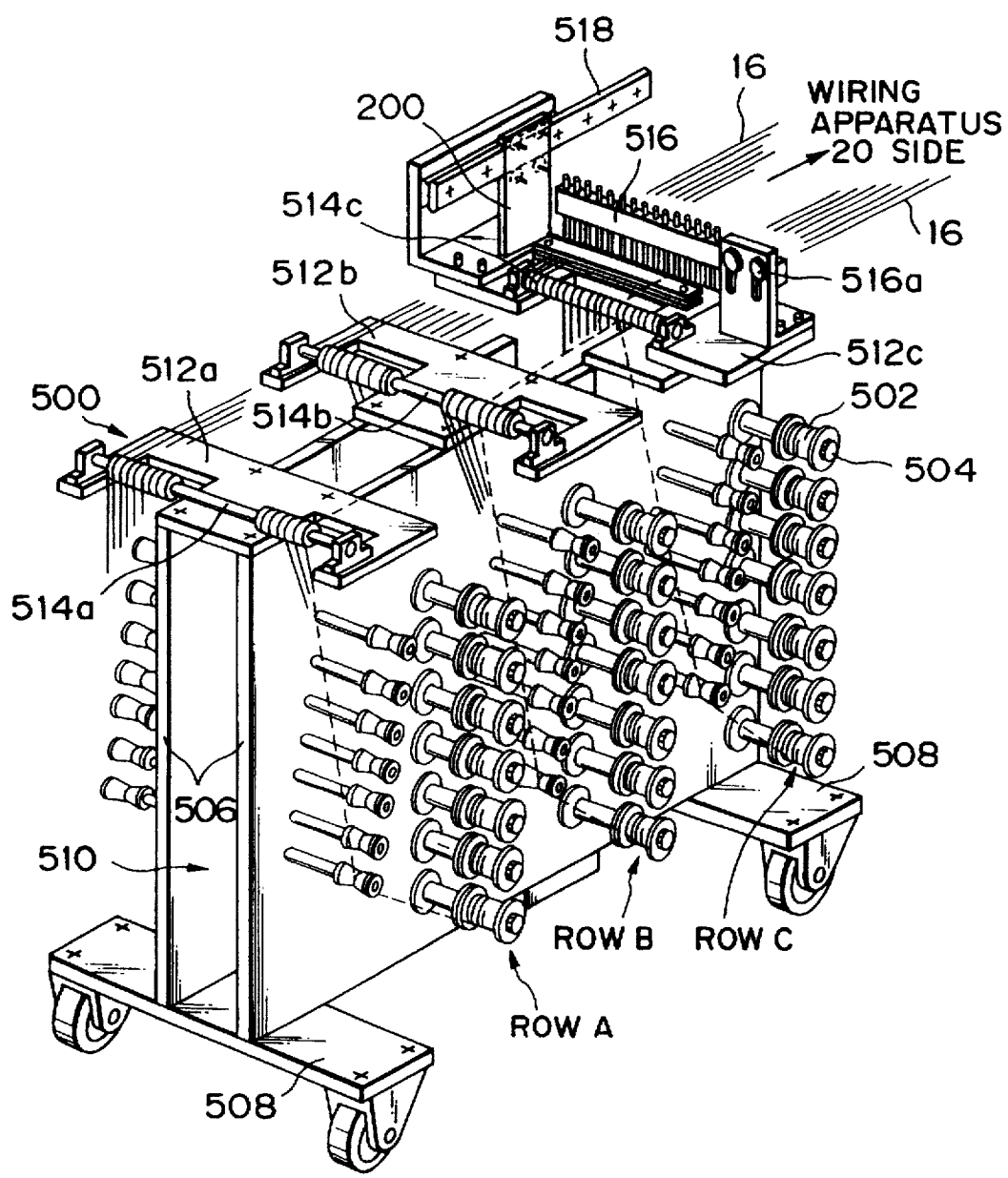
FIG. 3 is a perspective view showing the arrangement of a bobbin cassette which supplies collector wires to the wiring apparatus.

FIG. 2 is a perspective view showing the overall arrangement of the wiring apparatus, and FIG. 3 is a perspective view showing the arrangement of a bobbin cassette that supplies collector wires to the wiring apparatus. This wiring apparatus 20 temporarily fixes forty-two (42) collector wires 16 above the 300-mm square slab 12 at a spacing of 5 mm.

Referring to FIG. 2, a slack removing mechanism 24, a step roller mechanism 26, and an extending mechanism 28 are arranged on a frame 22 installed on the floor of a factory or the like in this order from the front side in the drawing. The slack removing mechanism 24 removes the slack of the collector wires 16 when the forty-two collector wires 16 drawn from a bobbin cassette 500 are supplied to the slab 12. The step roller mechanism 26 applies a tension to the collector wires 16 fed from the slack removing mechanism 24. The extending mechanism 28 extends the collector wires 16, to which the tension has been applied by the step roller mechanism 26, above the slab 12. The arrangement of these mechanisms will be described later.

The bobbin cassette 500 has eighty-four (84) bobbins 502 on which the collector wires 16 are wound independently. The bobbin cassette 500 is connected to the front side in the drawing of the frame 22. The bobbin cassette 500 has forty-two (42) bobbin shafts 504 for rotatably supporting the bobbins 502. Two bobbins 502 are mounted on each bobbin shaft 504.

The structure of the bobbin cassette 500 will be described in detail with reference to FIG. 3.

The bobbin cassette 500 has a bobbin cassette body 510 at its central portion. The bobbin cassette body 510 is constituted by a vertical member 506 which is provided vertically upright and leg portions 508 with castors for supporting the vertical member 506. Twenty-one bobbin shafts 504 extending in the horizontal direction are provided to each of the right and left surfaces of the vertical member 506, resulting in a total of forty-two bobbin shafts. The twenty-one bobbin shafts 504 arranged on each side surface of the vertical member 506 are divided into three rows A, B, and C each consisting of seven bobbin shafts 504. As described above, two bobbins 502 are mounted on each bobbin shaft 504. The reason why two bobbins are mounted on each bobbin shaft 504 in this manner will be described later.

Horizontal plates 512a, 512b, and 512c are arranged on the vertical member 506 to respectively correspond to the rows A, B, and C of bobbin shafts 504. Direction switching pulleys 514a, 514b, and 514c for switching the direction of the collector wires 16 from the vertical direction to the horizontal direction are respectively rotatably supported on these horizontal plates 512a, 512b, and 512c. Seven independent grooves are formed in each of the right and left portions of each of the direction switching pulleys 514a, 514b, and 514c to guide the collector wires 16. The collector wires 16 fed from the bobbins 502 are fitted in these grooves in a one-to-one correspondence. The spacing of these grooves is set to 5 mm, which is the same as the spacing at which the collector wires 16 are temporarily fixed on the slab 12. Accordingly, the forty-two collector wires 16 drawn from the bobbins 502 on the forty-two bobbin shafts 504 are supplied from the bobbin cassette 500 to the wiring apparatus 20 while they are arranged horizontally at the 5-mm spacing.

A wire press member 516 for temporarily gripping and setting the forty-two collector wires 16 drawn from the bobbin cassette 500 is arranged on the upper right surface of the horizontal plate 512c. The wire press member 516 is manually opened or closed with bolts 516a. A slide rail 518 is provided on the left of the horizontal plate 512c. When at least one of the forty-two collector wires 16 becomes discontinuous, the slide rail 518 horizontally and slidably guides a restoring gripper that restores the discontinuous wire. The slide rail 518 is provided at the same height as that of a slide rail 30 (see FIG. 2) which is provided to the wiring apparatus 20 to horizontally guide the restoring gripper. When the bobbin cassette 500 is connected to the wiring apparatus 20, the slide rails 518 and 30 are coupled to each other. The function of this restoring gripper will be described later.

Since the bobbin cassette 500 is provided with the castors as described above, it can be easily detached from the wiring apparatus 20 to exchange for another bobbin cassette. Accordingly, when any one of the forty-two bobbin shafts 504 arranged on the bobbin cassette 500 becomes empty, it can be exchanged with a new one together with the bobbin cassette 500, so that the stop time of the wiring apparatus can be minimized when the collector wires 16 have run out.

Although the wire press member 516 is opened or closed manually in the above description, it can be opened or closed automatically by using an air cylinder or the like.

The arrangement of the slack removing mechanism 24, the step roller mechanism 26, and the extending mechanism 28 shown in FIG. 2 will be described in detail with reference to FIGS. 2, 4, and 5A to 5C.

Figure 4:
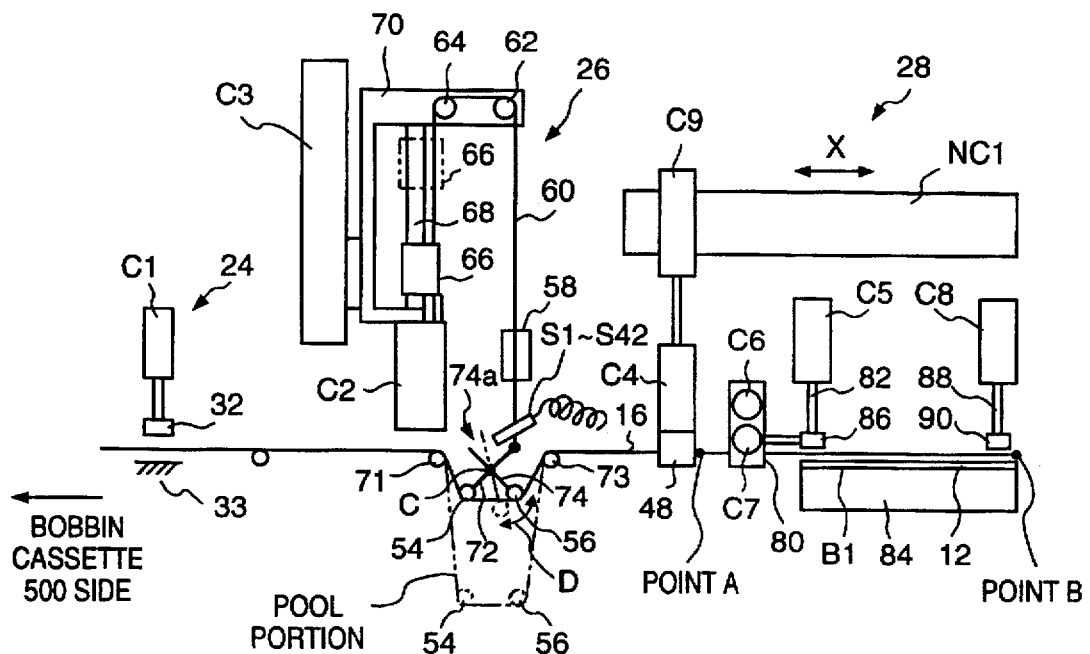
FIG. 4 is a side view schematically showing the arrangement of a slack removing mechanism, a step roller mechanism, and an extending mechanism shown in FIG. 2.

FIG. 4 is a side view schematically showing the arrangement of the slack removing mechanism 24, the step roller mechanism 26, and the extending mechanism 28 shown in FIG. 2.

Figure 5A:
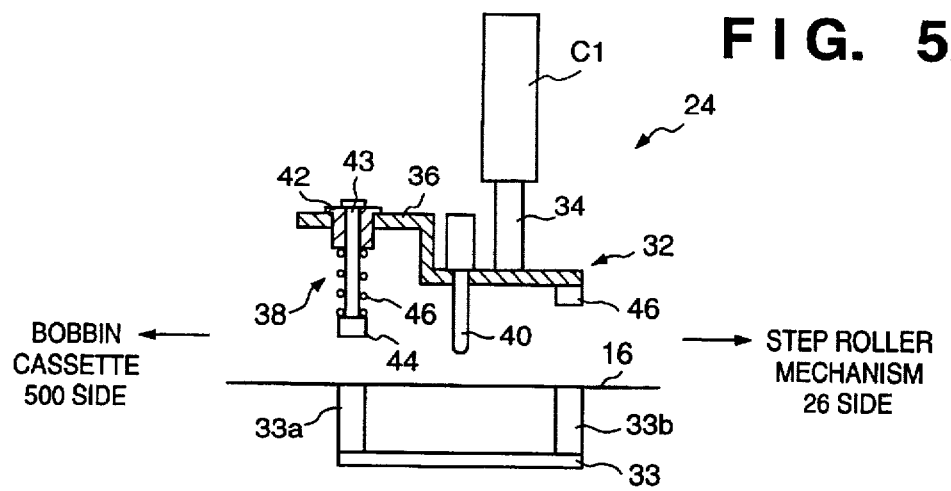
FIGS. 5A to 5C are views for explaining the operation of the slack removing mechanism.
Figure 5B:
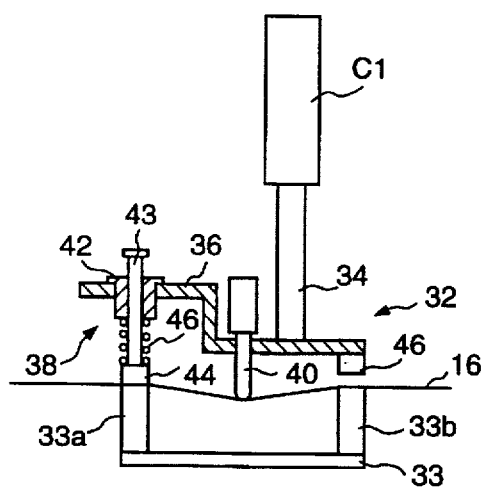
Figure 5C:
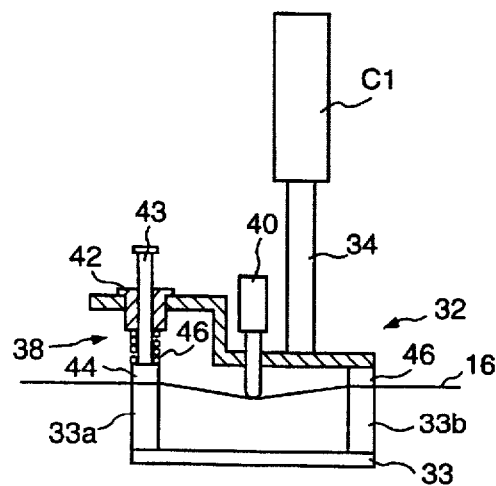

Referring to FIG. 4, the slack removing mechanism 24 removes the slack or non-uniform tension of each of the forty-two collector wires 16. FIGS. 5A to 5C show the arrangement of the slack removing mechanism 24 in detail.

Referring to FIGS. 2, 4, and 5A to 5C, the slack removing mechanism 24 is constituted by an air cylinder C1, a slack removing portion 32, and a support table 33. The air cylinder C1 is arranged between the bobbin cassette 500 and the step roller mechanism 26 in the vertical direction. The slack removing portion 32 is connected to the air cylinder C1. The support table 33 supports the collector wires 16 from below. The slack removing portion 32 is constituted by a horizontal plate 36, elastic mechanisms 38, slack removing weights 40, and a wire press member 46. The horizontal plate 36 is fixed to the distal end portion of a piston rod 34 of the air cylinder C1 to form two steps. The elastic mechanisms 38 are provided on the left side of the horizontal plate 36. The slack removing weights 40 are provided at substantially the central portion of the horizontal plate 36 to be slidable in the vertical direction. The wire press member 46 is provided on the right side of the horizontal plate 36. Each elastic mechanism 38 is constituted by a slide guide 42, a slide shaft 43, a wire press member 44, and a compression spring 46. The slide guide 42 is fixed to the horizontal plate 36. The slide shaft 43 is inserted in the slide guide 42 to be slidable in the vertical direction. The wire press member 44 is fixed to the distal end portion of the slide shaft 43. The compression spring 46 constantly biases the wire press member 44 downward. The wire press member 44 is formed to extend along a direction (a direction along which the collector wires 16 are arranged) perpendicular to the surface of the sheet of FIGS. 5A to 5C, and simultaneously clamps the forty-two collector wires 16 together with a wire press member 33a on the support table 33. Two elastic mechanisms 38 are arranged to support substantially the two end portions of the wire press member 44 in the extending direction (see FIG. 2).

The slack removing weights 40 are arranged at substantially the central portion of the horizontal plate 36 to be slidable in the vertical direction, and depress the collector wires 16 downward with their lower end portions. The slack removing weights 40 are provided to respectively correspond to the forty-two collector wires 16 in a one-to-one correspondence, as shown in FIG. 2, so that they can independently remove the slack of the respective collector wires 16.

The wire press member 46 for clamping the collector wires 16 together with a wire press member 33b on the support table 33 is fixed at the right end portion of the horizontal plate 36. The wire press member 46 is also formed to extend along the direction perpendicular to the surface of the sheet of FIGS. 5A to 5C, and can simultaneously clamp all of the forty-two collector wires 16.

As shown in FIG. 2, the air cylinder C1 is fixed to the support member 52 connected to a support frame 50 fixed on the frame 22.

The operation of the slack removing mechanism 24 having the above arrangement will be described with reference to FIGS. 5A to 5C.

In the state shown in FIG. 5A, assume that the collector wires 16 drawn from the bobbin cassette 500 extend to reach the position of a gripper 48 shown in FIG. 4 through the step roller mechanism 26. In this state, the tension and slack of the collector wires 16 unwound from the bobbins 502 of the bobbin cassette 500 vary. The role of the slack removing mechanism 24 is to make the tension of the collector wires 16 constant after they pass through the slack removing mechanism 24 (on the step roller mechanism 26 side).

The air cylinder C1 is actuated from the state shown in FIG. 5A to move the horizontal plate 36 downward. When the horizontal plate 36 starts to move downward, during this downward movement, the wire press member 44 of the elastic mechanism 38 depresses the leading end portions of the collector wires 16 with the downward biasing force of the wire press member 46 to temporarily clamp the collector wires 16. At this time, as the slack removing weights 40 are also moved downward, their lower end portions contact the collector wires 16 to push them downward by an amount corresponding to the slack of the collector wires 16. As the slack removing weights 40 are provided in a one-to-one correspondence to the collector wires 16, the forty-two collector wires 16 are separately kept taut by the corresponding slack removing weights 40, and the forty-two collector wires 16 are set to have the same tension by the slack removing mechanism 24. Thereafter, the air cylinder C1 is further moved downward as shown in FIG. 5C, and the wire press member 46 provided at the rear end portion of the horizontal plate 36 depresses the collector wires 16, thereby clamping them.

In the above manner, all the forty-two collector wires 16 after the slack removing mechanism 24 are set to have the same tension.

The arrangement of the step roller mechanism 26 will be described with reference to FIGS. 2 and 4. The step roller mechanism 26 serves to apply a predetermined tension to the collector wires 16 when the gripper 48 draws them from the point A to the point B shown in FIG. 4, so that the collector wires 16 will not slack. When the leading ends of the collector wires 16 are located at the point A, the step rollers 54 and 56 pool the collector wires 16 for a predetermined length, as indicated by an alternate long and two short dashed line in FIG. 4. As the collector wires 16 are drawn to the point B by the gripper 48, the step rollers 54 and 56 are pushed up by the collector wires 16 with the weight 58 (actually the difference in weight between a balance weight 66 to be described later and weight 58) applied to them, to move upward to the position indicated by a solid line. At this time, since the collector wires 16 are drawn from the point A to the point B while moving the weight 58 upward, they are extended taut above the slab 12 with a predetermined tension.

In FIG. 4, the step roller mechanism 26 is basically constituted by the step rollers 54 and 56, a wire 60, the weight 58, pulleys 62 and 64, the balance weight 66, a slide shaft 68, a U-shaped frame 70, and air cylinders C3 and C2. The step rollers 54 and 56 guide the collector wires 16 and apply a predetermined tension to them. The wire 60 suspends the step rollers 54 and 56. The weight 58 is attached to a portion of the wire 60 in the vicinity of the step rollers 54 and 56. The pulleys 62 and 64 hang the wire 60. The balance weight 66 is attached to an end portion of the wire 60 which is opposite to a side where the step rollers 54 and 56 are attached. The slide shaft 68 supports the balance weight 66 to be slidable in the vertical direction. The frame 70 supports the slide shaft 68. The air cylinder C3 drives the frame 70 in the vertical direction. The air cylinder C2 is fixed to the frame 70 to push the balance weight 66 upward along the slide shaft 68.

The step roller 54 is rotatably attached to the distal end of a support member 72 fixed to the distal end of the wire 60.

The step roller 56 is rotatably attached to the distal end of a support rod 74 which is supported to the support member 72 to be swingable about a point C as the center in the direction of an arrow D with respect to the support member 72. One step roller 54, one step roller 56, and one support rod 74 are provided to correspond to each of the forty-two collector wires 16.

Forty-two proximity sensors S1 to S42 are attached to positions of the wire 60 which are slightly above the support member 72. When at least one of the collector wires 16 becomes discontinuous to lose its tension and the corresponding support rod 74 is accordingly pivoted clockwise about the point C as the center by its own weight, as indicated by an alternate long and two short dashed line, the corresponding one of the proximity sensors S1 to S42 detects that a rear end portion 74a of this support rod 74 comes close to it, thereby detecting wire discontinuity. Since the proximity sensors S1 to S42 are respectively provided to the forty-two support rods 74 in a one-to-one correspondence, they can detect that the forty-two collector wires 16 are discontinuous, respectively. In this embodiment, even if at least one of the forty-two collector wires 16 becomes discontinuous, a predetermined length of each of all the forty-two collector wires 16 is discarded, which will be described later in detail. Although discontinuity of each of the forty-two collector wires 16 is detected in this embodiment, it suffices if the discontinuity of at least one of the forty-two collector wires 16 can be detected. In this case, a laser beam or the like may be irradiated in a direction perpendicular to the surface of the sheet of FIG. 4, and when this laser beam is interrupted by the rear end portion 74a of a support rod 74, a light-receiving element may detect this disconnection. With this arrangement, the number of sensors can be decreased, thereby decreasing the cost of the apparatus.

Figure 16:
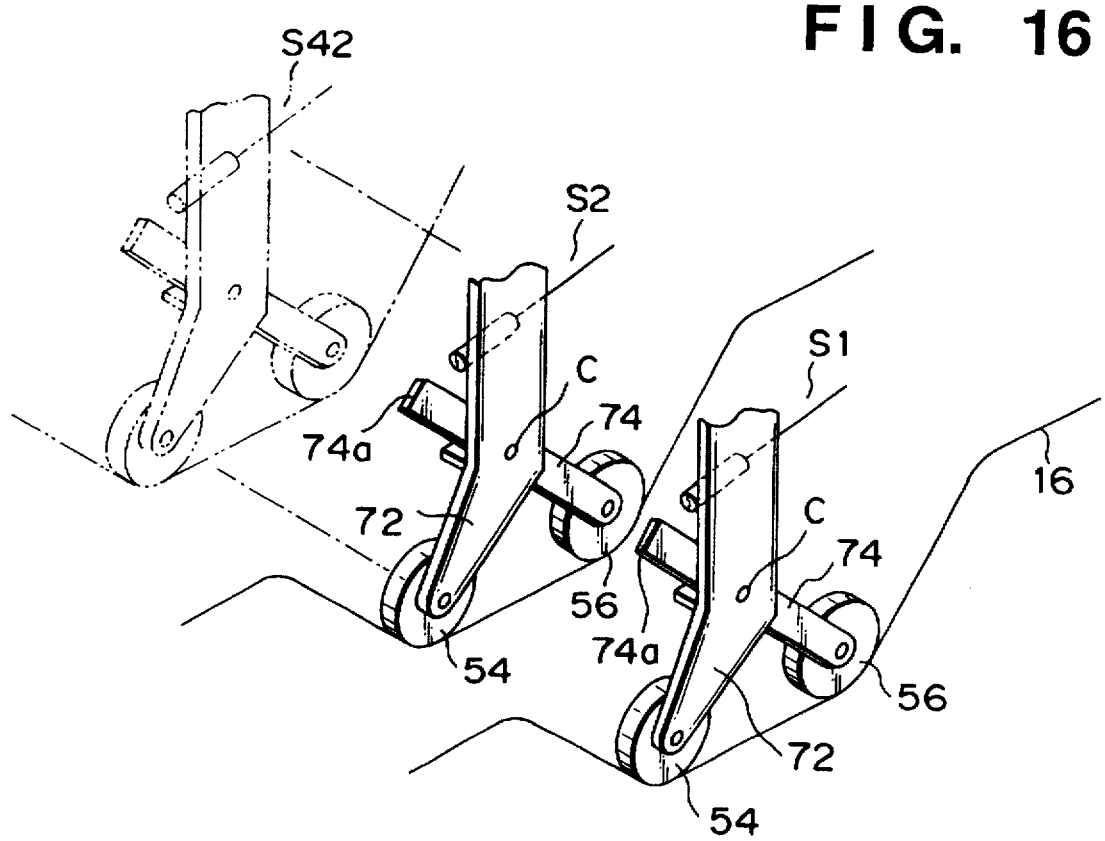
FIG. 16 is an enlarged perspective view of a proximity sensor portion.
Figure 17:
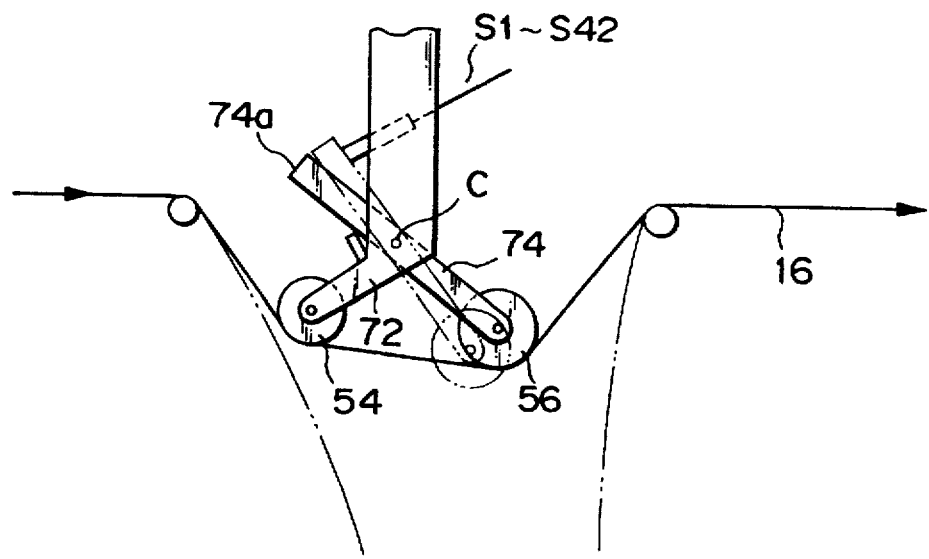
FIG. 17 is an enlarged side view of the proximity sensor portion.

FIG. 16 is an enlarged perspective view of the proximity sensor portion, and FIG. 17 is a side view of the same. As shown in FIG. 16, the proximity sensors S1 to S42 are provided to respectively correspond to the forty-two collector wires 16. When a collector wire 16 becomes discontinuous and the corresponding step roller 56 falls downward, s indicated by a broken line in FIG. 17, the corresponding support rod 74 is pivoted clockwise about the point C as the center, and the corresponding one of the proximity sensors S1 to S42 detects that the rear end portion 74a of the support rod 74 comes close to it. Thus, each one of the forty-two collector wires 16 that is discontinuous can be detected. As the proximity sensor, a metal proximity sensor, a photosensor, a laser sensor, or the like can be used.

In FIG. 4, the balance weight 66 is set to be lighter than the weight 58 by a predetermined weight. Thus, a difference in weight between the balance weight 66 and the predetermined weight 58 constantly acts on the collector wires 16, and a predetermined tension is applied to the collector wires 16 by this difference. The air cylinder C3 is mounted to a support member 52 fixed on the frame 22, as shown in FIG. 2. Rollers 71 and 73 are arranged before and after the step rollers 54 and 56 to guide the collector wires 16 while supporting them.

The arrangement of the extending mechanism 28 will now be described with reference to FIGS. 2 and 4.

The extending mechanism 28 is basically constituted by the gripper 48, an air cylinder C9, an NC robot NC1, air cylinders C5 and C8, a cutter 80, and a table 84. The gripper 48 grips the collector wires 16. The air cylinder C9 drives the gripper 48 in the vertical direction. The NC robot NC1 moves the gripper 48 from the rear end portion (point A) to the front end portion (point B) of the slab 12 together with the air cylinder C9 to extend them above the slab 12. The air cylinders C5 and C8 urge the collector wires 16 extended above the slab 12 against the double-coated tape 14 and adhere them to the two end portions of the slab 12. The cutter 80 is fixed to a piston rod 82 of the air cylinder C5 to cut the trailing end portions of the extended collector wires 16. The table 84 supports the slab 12.

The gripper 48 is driven by an air cylinder C4 provided to the gripper 48 to open or close. The NC robot NC1 moves the air cylinder C9 that supports the gripper 48 in the X-axis direction with a motor (not shown) and a ball screw coupled to the motor shaft. The motor is provided with a rotary encoder. A controller (to be described later) controls the operation of the NC robot NC1 in accordance with a detection signal from the encoder. A rear end press member 86 and the cutter 80 are fixed to the distal end portion of the piston rod 82 of the air cylinder C5. The rear end press member 86 urges the collector wires 16 against the rear end portion of the slab 12. Accordingly, the rear end press member 86 and the cutter 80 are integrally moved by the air cylinder C5 in the vertical direction. The cutter 80 has a stationary blade and a movable blade, which will be described later in detail. The movable blade is slid by an air cylinder C6 with respect to the stationary blade to cut the collector wires 16. After the stationary blade is temporarily moved downward among the forty-two collector wires 16, its position is finely adjusted by an air cylinder C7. This operation will be described later. A front end press member 90 for urging the leading end portions of the collector wires 16 against the upper surface of the front end portion of the slab 12 is fixed to the distal end of a piston rod 88 of the air cylinder C8. Furthermore, the table 84 fixes the slab 12 by vacuum suction with a suction mechanism B1.

As shown in FIG. 2, the NC robot NC1 and the air cylinders C5 and C8 are fixed to the support frame 50 on the frame 22. The table 84 is fixed on the frame 22.

Figure 6:
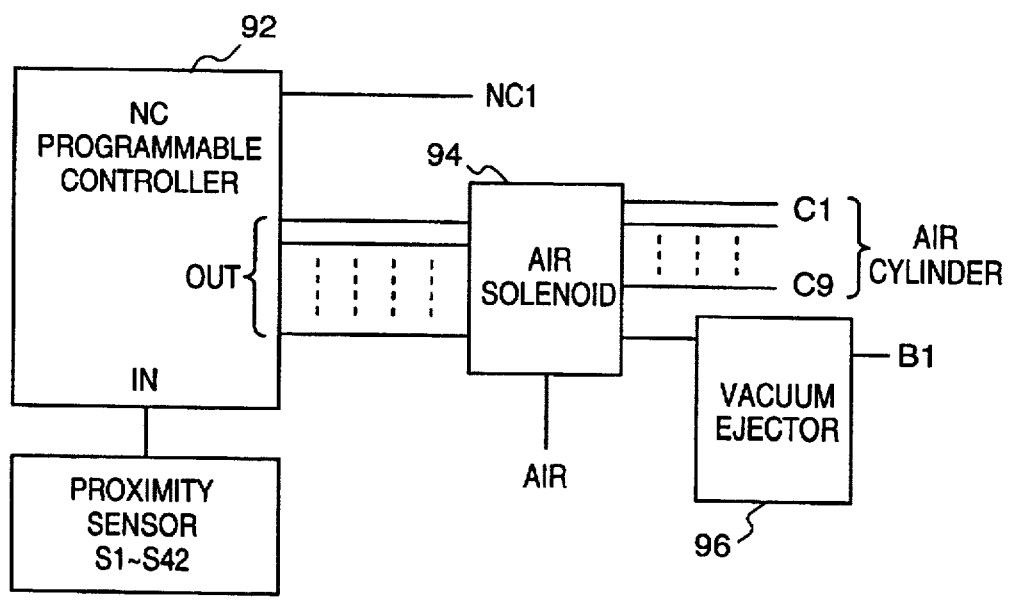
FIG. 6 is a block diagram showing the connecting state of the respective constituent elements of the wiring apparatus and a controller that controls them.

FIG. 6 is a block diagram for showing the connection of the above respective constituent elements and a controller that controls them.

Referring to FIG. 6, the proximity sensors S1 to S42 and the NC robot NC1 are connected to an NC programmable controller 92. Also, the air cylinders C1 to C9 and a suction mechanism B1 for holding the slab 12 by vacuum are connected to the NC programmable controller 92 through an air solenoid 94. The NC programmable controller 92 controls the operations of the NC robot NC1, the air solenoid 94, and a vacuum ejector 96 based on its internal program, detection signals from the proximity sensors S1 to S42, a detection signal from a rotary encoder in the NC robot NC1, and the like.

Figure 18:
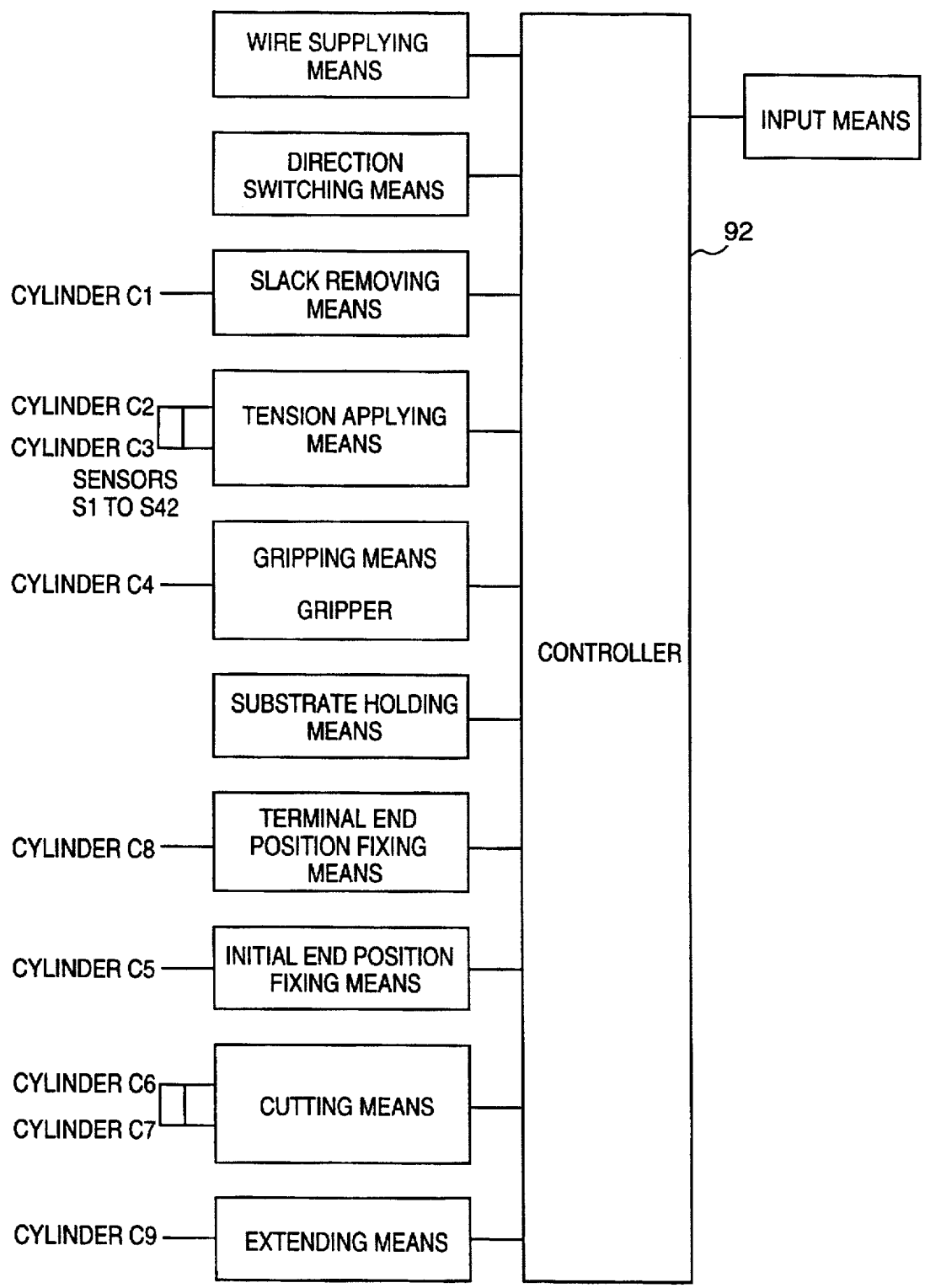
FIG. 18 is a block diagram showing the connecting state of the respective constituent elements of the wiring apparatus and the controller.

FIG. 18 is a block diagram further showing the connection of the respective constituent elements of the wiring apparatus 20 and the NC programmable controller 92.

The NC programmable controller 92 is connected to the bobbin cassette 500 serving as a wire supplying means, the direction switching pulleys 514a, 514b, and 514c serving as direction switching means, the slack removing mechanism 24 serving as a slack removing means, the step roller mechanism 26 serving as a tension applying means, the gripper 48 serving as a gripping means, the suction mechanism B1 serving as a substrate holding means, the air cylinder C8 serving as a terminal end position fixing means, the air cylinder C5 serving as an initial end position fixing means, the cutter 80 serving as a cutting means, the air cylinder C9 as an extending means and as an input means, e.g., a keyboard.

The structure of the gripper 48 will now be described with reference to FIGS. 7 to 9.

Figure 7:
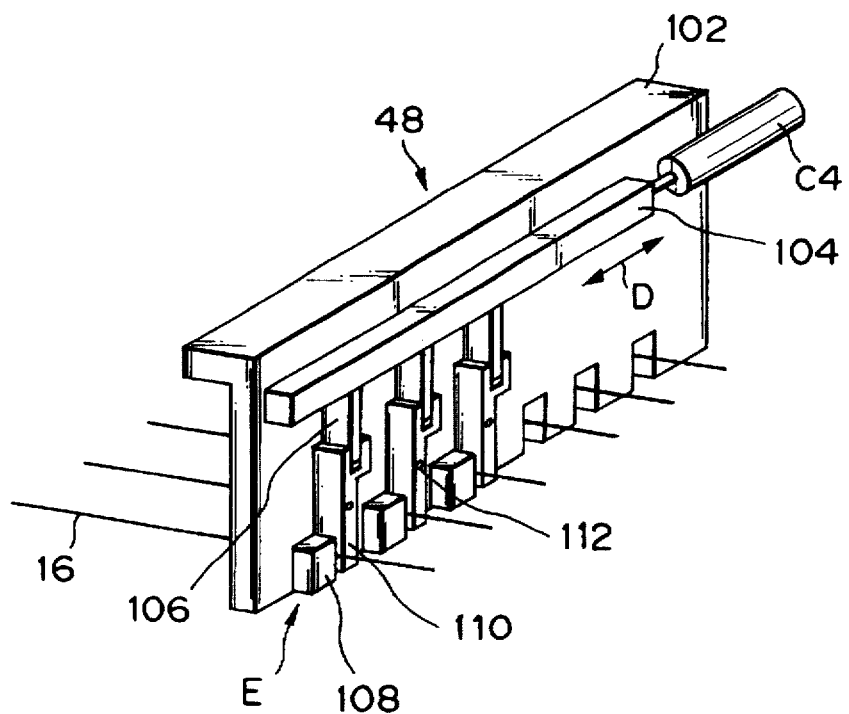
FIG. 7 is a perspective view showing the arrangement of a gripper.
Figure 8:
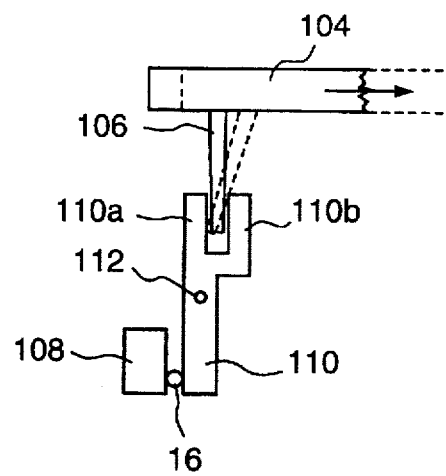
FIG. 8 is an enlarged view of a portion E of FIG. 7.

FIG. 7 is a perspective view showing the arrangement of the gripper 48. Referring to FIG. 7, the gripper 48 is basically constituted by a plate-like gripper body 102, a slide member 104, leaf springs 106, stationary fingers 108 and movable fingers 110, and the air cylinder C4. The gripper body 102 is formed to have a substantially L-shaped section. The slide member 104 is slidable horizontally with respect to the gripper body 102. The leaf springs 106 are mounted on the slide member 104 to extend downward from it. The stationary fingers 108 and the movable fingers 110 grip the collector wires 16. The air cylinder C4 serves as driving source for sliding the slide member 104 with respect to the gripper body 102.

The slide member 104 is supported by the gripper body 102 to be slidable in the direction of arrow D in FIG. 7 in a state wherein it will not drop from the gripper body 102, and is driven by the air cylinder C4 fixed to the gripper body 102 to slide in the direction of the arrow D. Forty-two stationary fingers 108 are fixed to the gripper body 102 at a spacing of 5 mm to respectively correspond to the forty-two collector wires 16, and grip the collector wires 16 together with the movable fingers 110. The forty-two movable fingers 110 are supported to be pivotal about forty-two support pins 112 that are fixed to the gripper body 102, while they oppose the forty-two stationary fingers 108. As shown in FIG. 8 which is an enlarged view of a portion E in FIG. 7, when the forty-two movable fingers 110 are pivoted clockwise, they grip the collector wires 16 together with the stationary fingers 108. When the movable fingers 110 are pivoted counterclockwise, they release the collector wires 16. The upper end portion of each movable finger 110 is branched into two portions to form two arm portions 110a and 110b. The forty-two leaf springs 106 fixed to the slide member 104 are inserted between the two arm portions 110a and 110b of the respective movable fingers 110. When the slide member 104 is slid in the direction indicated by an arrow in FIG. 8, the movable fingers 110 are pivoted through the elastic force of the leaf springs 106, thereby gripping the collector wires 16.

In the gripper 48 having the above arrangement, the movable fingers 110 are coupled to the slide member 104 through the leaf springs 106 that are independent of each other. Therefore, even if the spacings of the arrangement of the collector wires 16 slightly vary or the diameters of the collector wires 16 slightly vary, these variations are absorbed by the leaf springs 106, so that the 42 collector wires 16 can be simultaneously gripped reliably between the stationary fingers 108 and the movable fingers 110. Since the force that grips the collector wires 16 is determined not by the driving force of the air cylinder C4 but by the elastic force of the leaf springs 106, an excessive force will not act on the collector wires 16, thereby preventing the collector wires 16 from being damaged.

Figure 9:
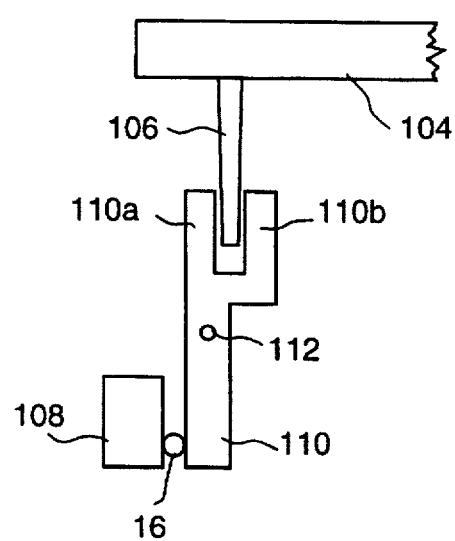
FIG. 9 shows the positional relationship between a stationary finger and a movable finger when they grip a collector.

As shown in FIG. 9, the distance in the horizontal direction between the stationary fingers 108 and the support pins 112 is set such that the gripping surfaces of the stationary fingers 108 and movable fingers 110 become parallel to each other when the stationary fingers 108 and the movable fingers 110 grip the collector wires 16. In this manner, the collector wires 16 are designed to be gripped in the stablest state.

The arrangement of the cutter 80 will be described with reference to FIG. 10.

Figure 10:
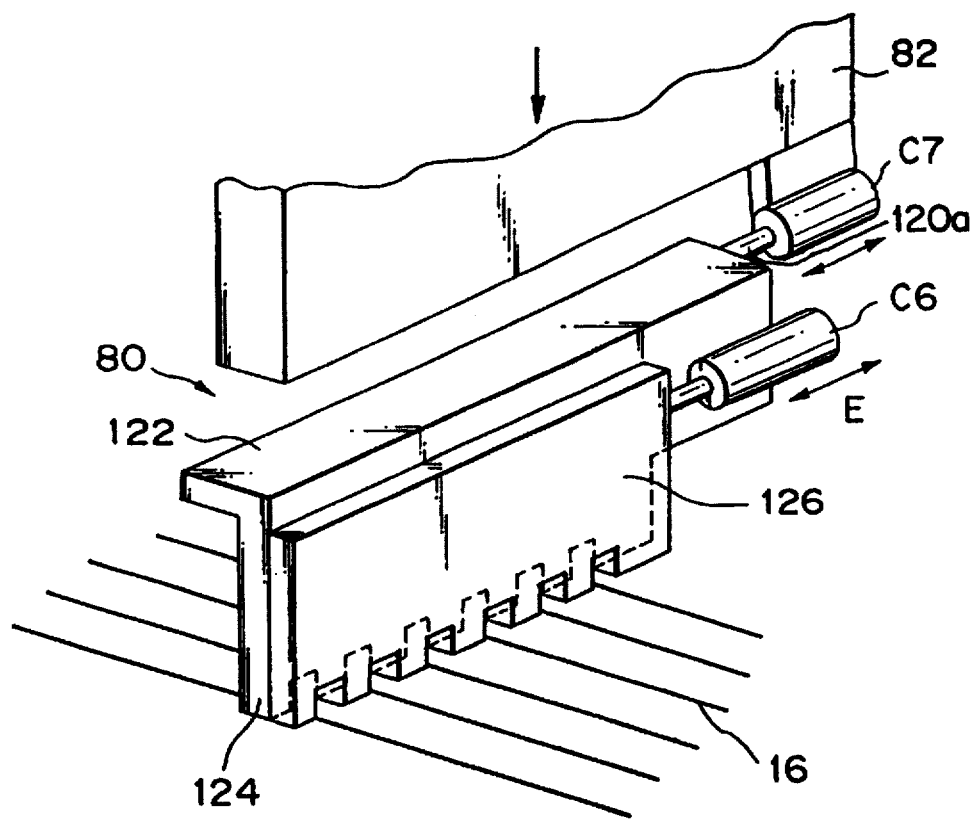
FIG. 10 is a perspective view showing the arrangement of a cutter.

FIG. 10 is a perspective view showing the arrangement of the cutter 80. Referring to FIG. 10, the cutter 80 is mainly constituted by the air cylinder C7, a cutter body 122, a stationary blade 124, a movable blade 126, and the air cylinder C6. The air cylinder C7 is fixed to the piston rod 82 of the air cylinder C5 shown in FIG. 4. The cutter body 122 is fixed to a piston rod 120a of the air cylinder C7. The stationary blade 124 is formed at the lower portion of the cutter body 122. The movable blade 126 is attached to the cutter body 122 to be slidable in the horizontal direction. The air cylinder C6 serves as a driving source to slide the movable blade 126 with respect to the stationary blade 124.

The stationary blade 124 is integrally formed at the lower portion of the cutter body 122 having a substantially L-shaped section. The stationary blade 124 is formed into comb teeth having forty-two notches, as indicated by a broken line in FIG. 10, so that its teeth enter gaps between the forty-two collector wires 16. The movable blade 126 is supported to be slidable in the direction of arrow E in FIG. 10 such that it will not drop from the cutter body 122. The lower portion of the movable blade 126 is formed into comb teeth having forty-two notches, in the same manner as the stationary blade 124. The width of each of the stationary and movable blades corresponding to the comb teeth is set to be smaller than the spacing of the forty-two collector wires 16, i.e., to be smaller than 5 mm. When the forty-two collector wires 16 are inserted in the notches of the stationary blade 124 and the movable blade 126, and the movable blade 126 is slid by the air cylinder C6 fixed to the cutter body 122, the cutter 80 can sandwich and cut the collector wires 16. The air cylinder C7 moves the entire stationary blade 124 relative to the forty-two collector wires 16.

The cutting operation of the cutter 80 having the above arrangement will be described with reference to FIGS. 11A to 11C.

Figure 11A:
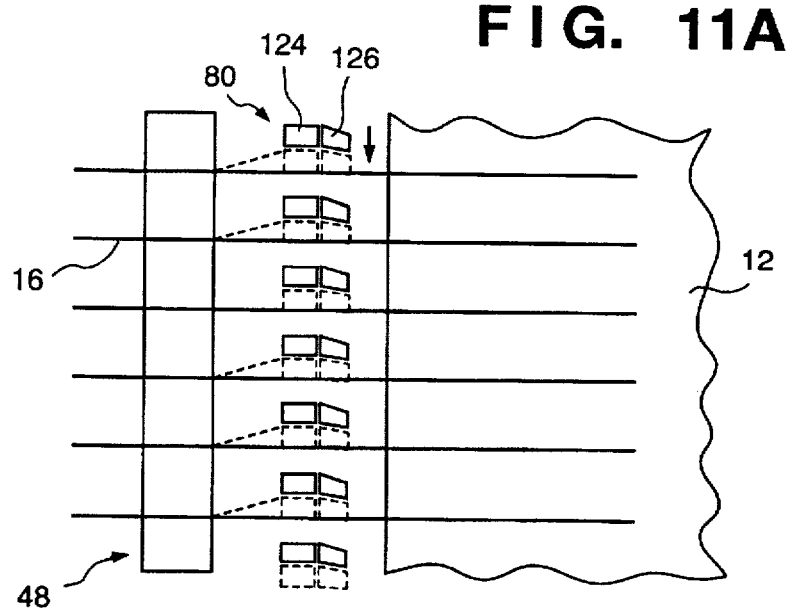
FIGS. 11A to 11C are plan views of the cutter.
Figure 11B:
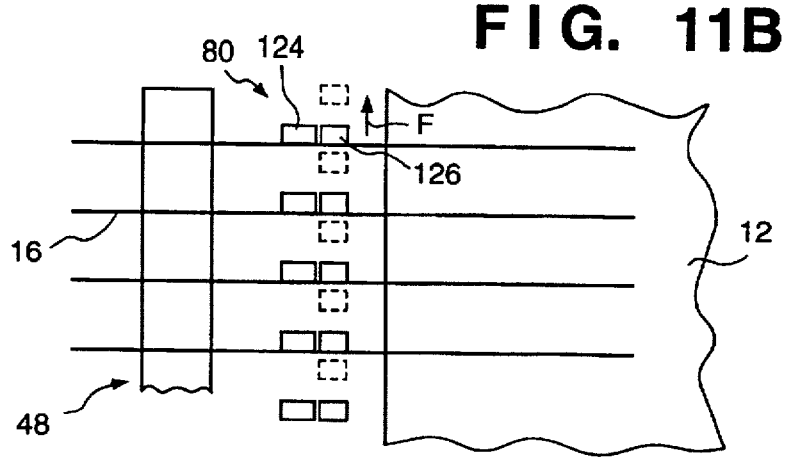
Figure 11C:
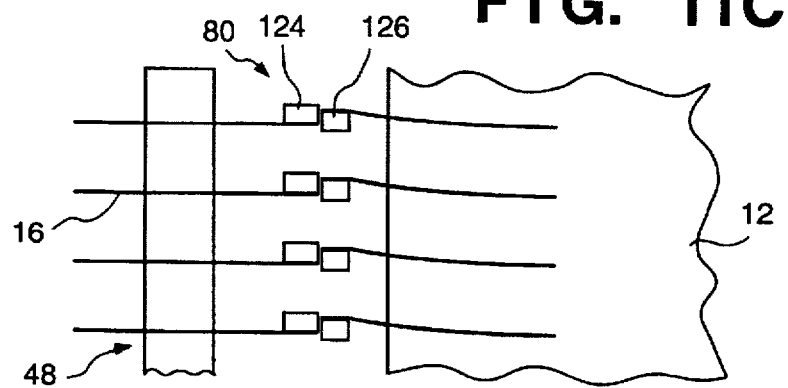

FIGS. 11A to 11C are plan views of the cutter 80 seen from above. Referring to FIGS. 11A to 11C, the cutter 80 simultaneously cuts the forty-two collector wires 16 at a position between the gripper 48 and the slab 12. As shown in FIG. 11A, the air cylinder C5 is pushed out to move the cutter body 122 downward such that the stationary blade 124 and movable blade 126 of the cutter 80 respectively enter the gaps between the forty-two collector wires 16. At this time, the rear end press member 86 urges the trailing end portions of the collector wires 16 against the rear end portion of the slab 12 simultaneously. In the step shown in FIG. 11A, the stationary blade 124 and the movable blade 126 are inserted at substantially the center of the two adjacent collector wires 16 with a small gap with respect to the collector wires 16 so that they will not contact the collector wires 16.

For example, if the movable blade 126 is slid with respect to the stationary blade 124 in this state to cut the collector wires 16, the collector wires 16 might be bent at portions where they are gripped by the gripper 48 as the fulcrum, as indicated by the alternate long and two short dashed lines in FIG. 11A. When the collector wires 16 are bent in this manner, they cannot be extended taut above the following slab 12 in the subsequent step. For this reason, in this embodiment, after the stationary blade 124 and the movable blade 126 are caused to enter the gaps between the collector wires 16, the air cylinder C7 is actuated to shift the stationary blade 124 and the movable blade 126 to positions where they substantially contact the collector wires 16, as indicated by a broken line in FIG. 11A. In this state, the air cylinder C6 is actuated to slide the movable blade 126 in the direction indicated by arrow F, as shown in FIG. 11B, thereby cutting the collector wires 16. At this time, as shown in FIG. 11C, the collector wires 16 on the slab 12 side are slightly bent as they are dragged by the movable blade 126. However, since the collector wires 16 on the slab 12 are urged against the slab 12 by the rear end press member 86, this bend will not adversely affect the collector wires 16 located on the slab 12, thereby not causing problems.

In contrast to this, assume that the positional relationship between the stationary blade 124 and the movable blade 126 is opposite to that shown in FIG. 11C. Namely, assume that the stationary blade 124 is located on the slab 12 side whereas the movable blade 126 is located on the gripper 48 side. In this case, portions of the collector wires 16 on the side where they are gripped by the gripper 48 will be bent, which poses a problem. Therefore, in this embodiment, the stationary blade 124 must be on the gripper 48 side and the movable blade 126 must be on the slab 12 side, which is another important point.

After the portions of the collector wires 16 on the side where they are gripped by the gripper 48 are prevented from being bent in this manner, the forty-two collector wires 16 are simultaneously cut.

The wiring operation of the wiring apparatus having the above arrangement will be described with reference to FIGS. 12A to 12F and the flow chart of FIG. 13. Note that in FIGS. 12A to 12F, for illustrative convenience, the step rollers 54 and 56 and the pulleys 62 and 64 are shown as one roller and one pulley.

Figure 12A:
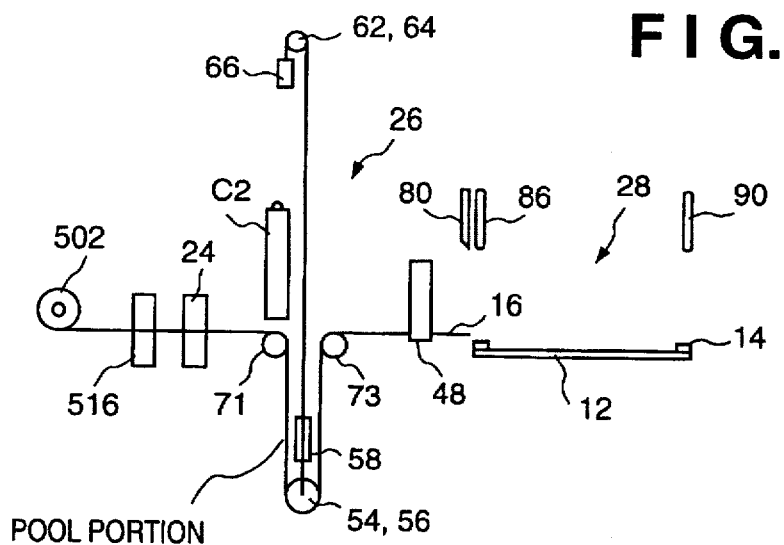
FIGS. 12A to 12F are views for explaining the wiring operation of the wiring apparatus.
Figure 13:
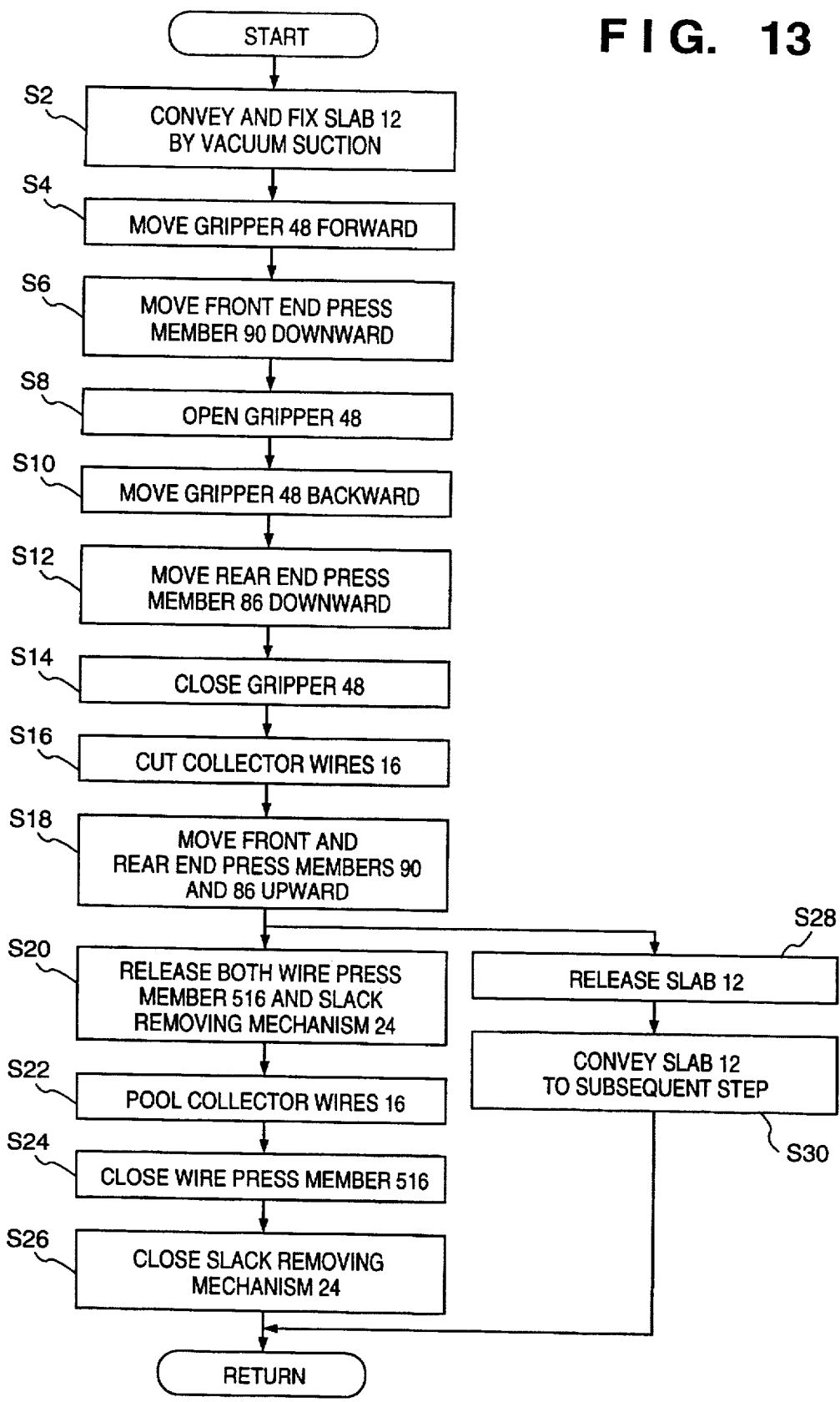
FIG. 13 is a flow chart showing the wiring operation of the wiring apparatus.

As a preparatory step for starting the wiring operation, as shown in FIG. 12A, the collector wires 16 are unwound from the bobbins 502 to be gripped by the gripper 48 and are pooled in the step roller mechanism 26 portion. The slack in the collector wires 16 between the slack removing mechanism 24 and the gripper 48 is removed by the slack removing mechanism 24. Note that the leading ends of the collector wires 16 are gripped by the gripper 48 as they project about 10 mm from the gripper 48.

Figure 12B:
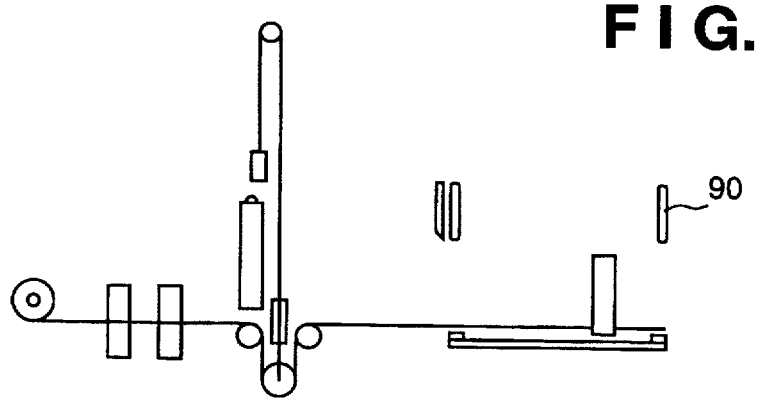

Thereafter, the slab 12 is supplied onto the table 84, and the slab 12 is fixed on the table 84 by suction with the suction mechanism B1 (step S2). The NC robot NC1 is actuated to move the gripper 48 forward, thereby feeding the leading ends of the collector wires 16 to the front end portion of the slab 12, as shown in FIG. 12B (step S4). At this time, since the wire press member 516 and the slack removing mechanism 24 are kept closed, the collector wires 16 are clamped between the wire press member 516 and the slack removing mechanism 24. As the gripper 48 is moved forward, the pool amount of the collector wires 16 at the step roller mechanism 26 is decreased gradually. As the pool amount is decreased, the collector wires 16 push the weight 58 upward. Therefore, a weight corresponding to the weight difference between the weight 58 and the balance weight 66 acts on the collector wires 16, thereby applying a predetermined tension to the collector wires 16. Thus, the collector wires 16 are extended taut above the slab 12.

Figure 12C:
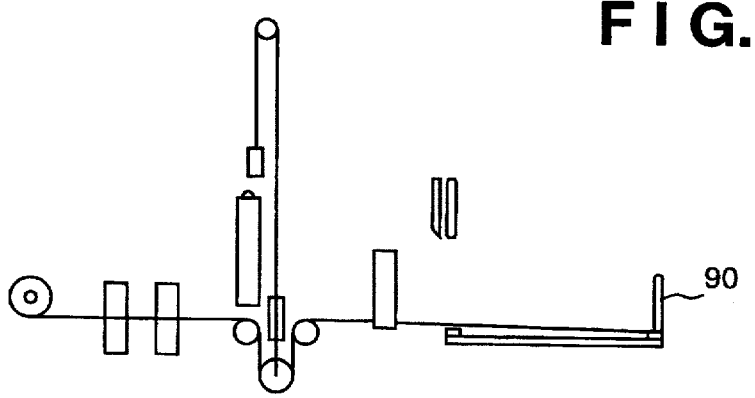

When the leading ends of the collector wires 16 are fed to the front end portion of the slab 12 by the gripper 48, the air cylinder C8 is actuated to adhere the distal ends of the collector wires 16 onto the double-coated tape 14 with the front end press member 90, as shown in FIG. 12C (step S6). While the leading ends of the collector wires 16 are urged against the double-coated tape 14 with the front ends press member 90, the air cylinder C4 is actuated to open the gripper 48 (step S8). Then, NC robot NC1 is actuated again to move the gripper 48 backward to the initial position (step S10).

Figure 12D:
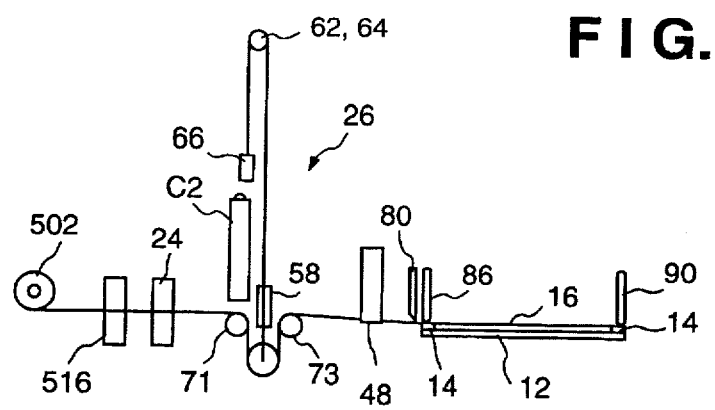

Subsequently, the air cylinder C5 is actuated to move the rear end press member 86 and the cutter 80 downward, as shown in FIG. 12D (step S12). Thus, the collector wires 16 are urged onto the double-coated tape 14 by the rear end press member 86. The stationary blade 124 and movable blade 126 of the cutter 80 enter the gaps between the collector wires 16, as shown in FIG. 11A.

When the downward movement of the rear end press member 86 and the cutter 80 ends, the air cylinder C4 is actuated to prepare the collector wires 16 for cutting. The gripper 48 is closed to clamp the collector wires 16 (Step S14).

The air cylinder C7 is actuated to shift the stationary blade 124 and movable blade 126 of the cutter 80 to a position where they substantially contact the collector wires 16, as shown in FIG. 11B. Then, the air cylinder C6 is actuated to cut the collector wires 16 (step S16).

Figure 12E:
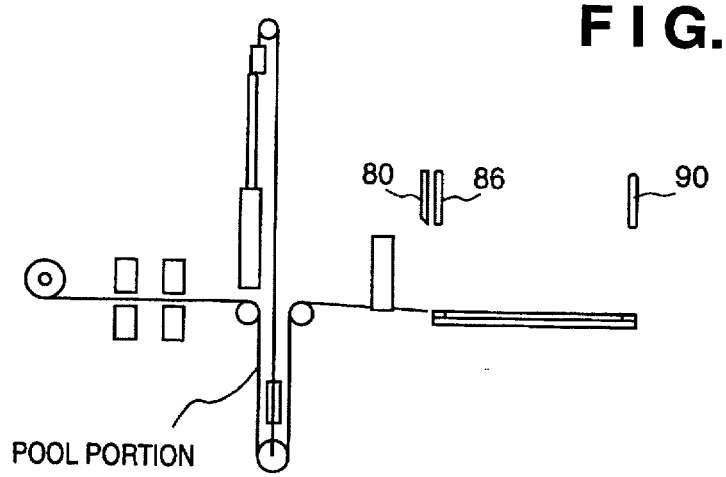
Figure 12F:
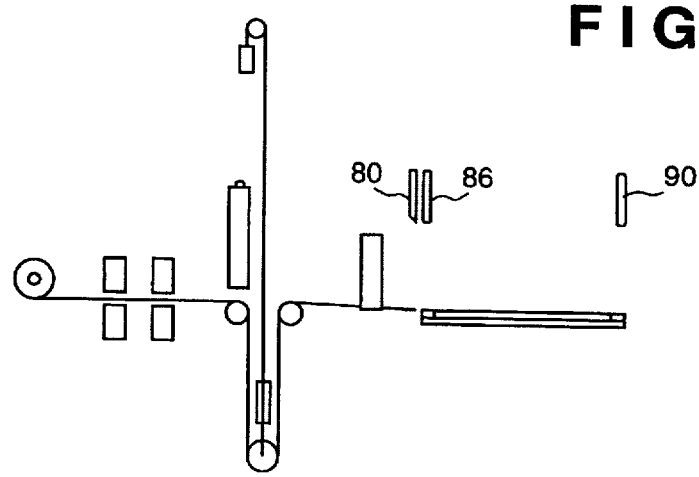

When the cutting operation of the collector wires 16 is ended, the air cylinders C5 and C8 are actuated to move the front end press member 90, the rear end press member 86, and the cutter 80 upward, as shown in FIG. 12E (step S18). Almost simultaneously, the wire press member 516 is opened manually and the air cylinder C1 is actuated to open the slack removing mechanism 24 (step S20). The air cylinder C2 is actuated to move the balance weight 66 upward. When the balance weight 66 is moved upward, the weight of the weight 58 entirely acts on the collector wires 16. Thus, the collector wires 16 are unwound from the bobbins 502 and pooled by the step roller mechanism 26 (step S22).

Subsequently, the air cylinder C2 is retracted, and the wire press member 516 is closed manually to clamp the collector wires 16 (step S24). Thereafter, the air cylinder C1 is actuated to close the slack removing mechanism 24, thereby removing the slack in the portions of the collector wires 16 between the slack removing mechanism 24 and the gripper 48 (step S26). If the slack in the portions of the collector wires 16 between the slack removing mechanism 24 and the gripper 48 is removed in this manner to make the tension constant, when the collector wires 16 pooled by the step roller mechanism 26 are to be drawn by the gripper 48, the weight of the weight 58 is dispersed to uniformly act on the forty-two collector wires 16. Thus, discontinuity or the like caused when the weight is centered on a small number of collector wires is prevented.

In step S18, when the front end press member 90 and the rear end press member 86 are moved upward, temporary fixing of the collector wires 16 onto the slab 12 is ended. Thus, release of the slab 12 (step S28) and conveyance of the slab 12 to the following step (step S30) are performed in parallel with the operations of steps S20 to S26.

The overall operation of the wiring apparatus of this embodiment has been described above.

A restoring operation which is taken when at least one of the forty-two collector wires 16 is discontinuous will now be described with reference to FIGS. 14A to 14D.

FIGS. 14A to 14D show the restoring procedure which is taken when a collector wire 16 is discontinuous. The continuity restoring operation is performed in different manners depending on whether the wire becomes discontinuous in a step before the wire press member 516 or in a step after the wire press member 516.

Figure 14A:
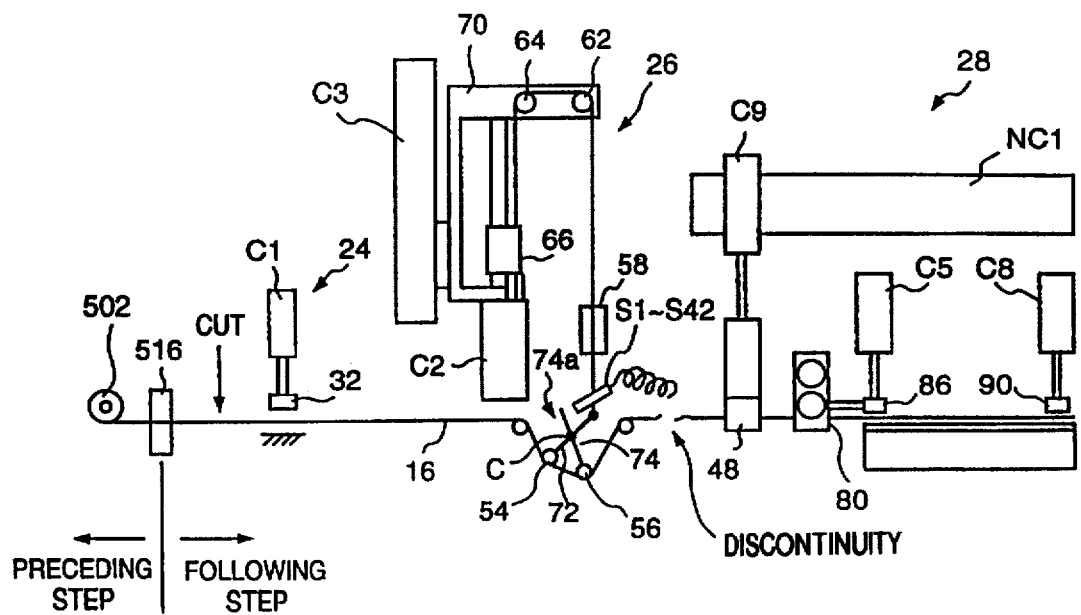
FIG. 14A to 14D are views showing a restoring procedure which is taken when a collector wire becomes discontinuous.

A case wherein a wire is discontinuous in a step after the wire press member 516 will be described. As shown in FIG. 14A, when any one of the forty-two collector wires 16 becomes discontinuous, the force acting to move the step roller 56 upward disappears. Thus, the support rod 74 is pivoted clockwise about the point C as the center. The corresponding one of the proximity sensors S1 to S42 detects the rear end portion 74a of this support rod 74, thereby detecting which collector wire has become discontinuous. In this embodiment, if at least one of the forty-two collector wires 16 becomes discontinuous, all of the forty-two collector wires 16 are discarded for a predetermined length. For this reason, as shown in FIG. 14A, the forty-two collector wires 16 are simultaneously cut at a position slightly behind the wire press member 516, and portions of the collector wires 16 behind the wire press member 516 are entirely discarded. When cutting the collector wires 16, the wire press member 516 is kept closed.

Figure 14B:
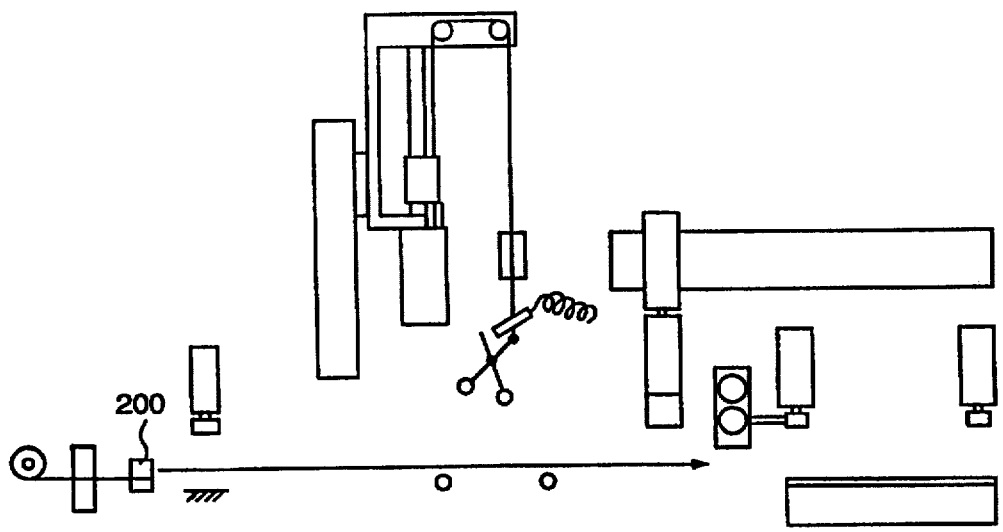

The air cylinders C1, C3, C9, C5, and C8 are actuated to move the slack removing portion 32, the step rollers 54 and 56, the gripper 48, the rear end press member 86, the cutter 80, and the front end press member 90 upward, as shown in FIG. 14B, so that they are away from the collector wires 16. In this state, a restoring gripper 200 mounted on the slide rails 518 and 30 (described above) is actuated, and the forty-two collector wires 16 that are cut are simultaneously gripped by the restoring gripper 200.

Figure 19:
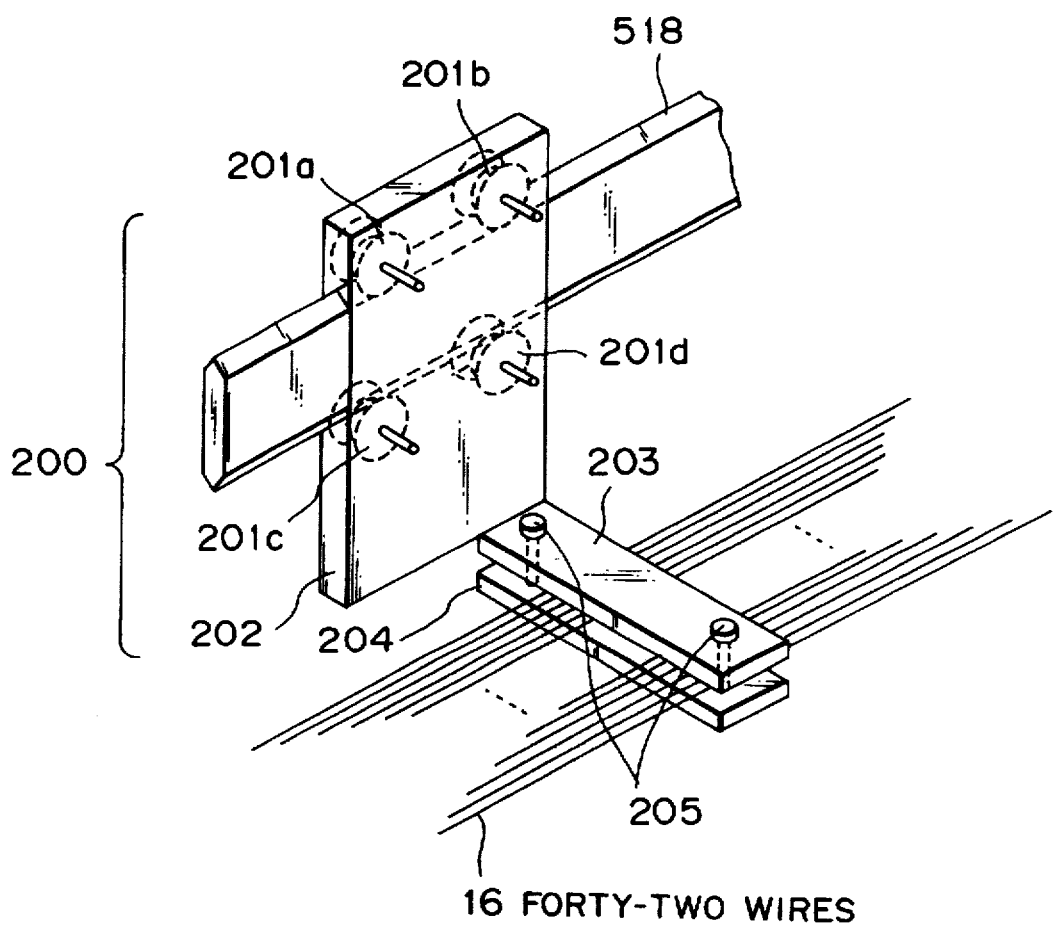
FIG. 19 is a view showing the arrangement of a restoring gripper.

The restoring gripper 200 will now be described. Referring to FIG. 3, the restoring gripper 200 is positioned on the wire bobbin side of the wire press member 516. This is shown in FIG. 19 in detail. Reference numerals 210a to 210d denote bearings which move while sandwiching the slide rail 518. The bearings 201a to 201d are attached to a side plate 202. An upper sandwiching plate 203 is attached to the side plate 202. Reference numeral 204 denotes a lower sandwiching late. The upper and lower sandwiching plates 203 and 204 are clamped with bolts 205. As the collector wires 16 are between the upper and lower sandwiching plates 203 and 204, they can be sandwiched and gripped by tightening the bolts 205. When a discontinuity is detected and the collector wires 16 are urged by the wire press member 516, the lower sandwiching plate 204 is inserted under the collector wires 16. The bearings 201a to 201d are engaged with the slide rail 518, and the side plate 202 is slid above the lower sandwiching plate 204. When the bolts 205 are tightened, the collector wires 16 can be sandwiched and fixed by the upper and lower sandwiching plates 203 and 204. The bolts 205 may be constantly set in a loose state regardless of whether discontinuity detection is to be performed.

Figure 14C:
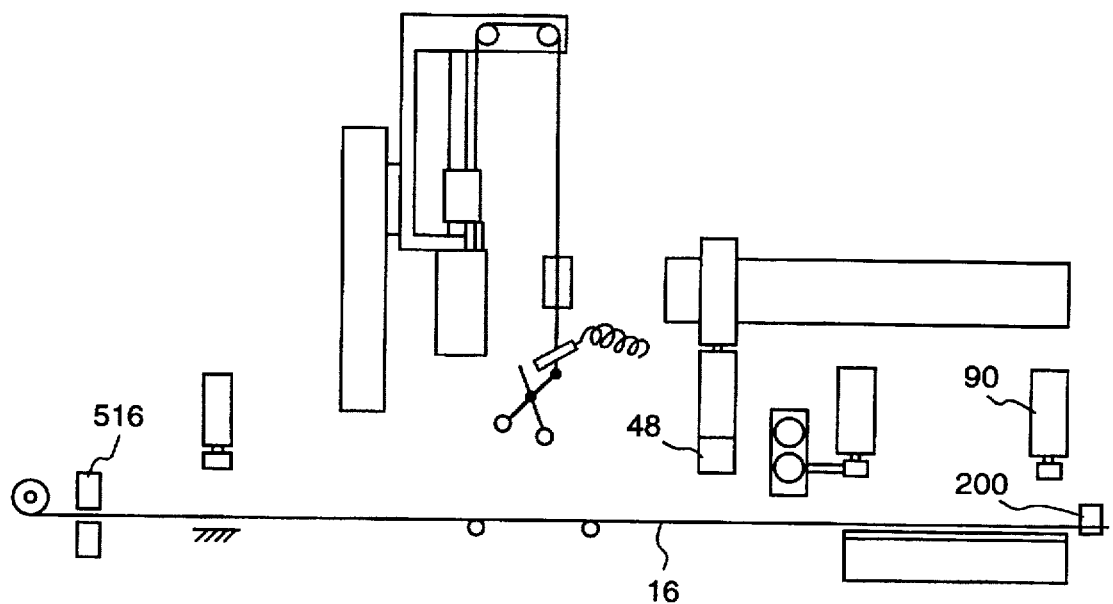
Figure 14D:
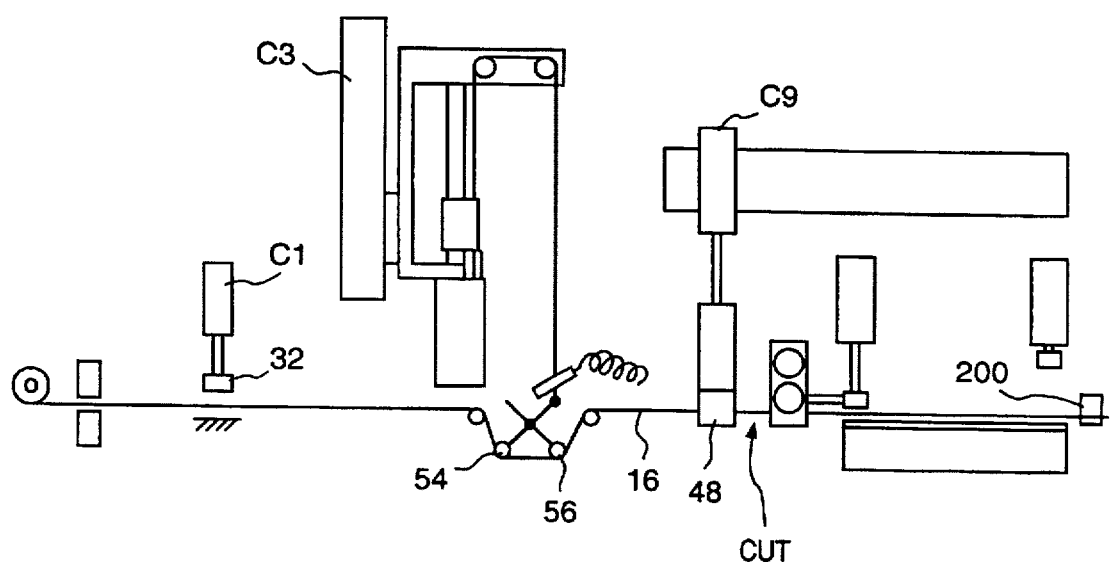

As shown in FIG. 14C, the wire press member 516 is opened and the restoring gripper 200 is slid along the slide rails 518 and 30 to draw the collector wires 16 to a position where the restoring gripper 200 is beyond the front end press member 90. This operation is performed manually. As shown in FIG. 14D, the gripper 48 is moved downward to grip the collector wires 16. Thereafter, the cutter 80 is moved downward to cut the collector wires 16 at a predetermined position. The restoring gripper 200 is moved until it is disengaged from the slide rail 30, and is removed. The air cylinders C1 and C3 are actuated to move the slack removing portion 32 and the step rollers 54 and 56 downward to be restored to the initial position. The bolts 205 are removed from the removed restoring gripper 200. The cut collector wires 16 are discarded, and the restoring gripper 200 is set at a predetermined position. After this, the normal operation as described above is performed.

When a collector wire 16 becomes discontinuous, a restoring operation is performed in the above manner.

A case will now be described wherein a discontinuity occurs in a step before the wire press member 516. Prior to that, the reason why two bobbins 502 are mounted on each bobbin shaft 504 of the bobbin cassette 500 will be described with reference to FIGS. 15A to 15E.

Assume that only one bobbin 502 is mounted on each bobbin shaft 504. In this case, when any one bobbin 502 becomes empty, this bobbin 502 must be exchanged. As the lengths of the collector wires 16 wound on the forty-two bobbins 502 vary, when one bobbin becomes empty, small amounts of collector wires 16 remain on the remaining forty-one bobbins 502. Therefore, if all the forty-two bobbins 502 are exchanged because one of them becomes empty, all the collector wires 16 left on the remaining bobbins are wastefully discarded. On the other hand, if only the empty bobbin is exchanged, another bobbin will become empty soon after this exchange. If bobbin exchange needs to be performed often, the production efficiency is decreased. In bobbin exchange, setting of the wire is very cumbersome, and the apparatus needs to be stopped during this wire setting. In this embodiment, two bobbins are mounted on each bobbin shaft to solve this problem.

A description will now be made with reference to FIGS. 15A to 15E.

In this embodiment, in the initial state of the wiring apparatus 20, two new bobbins 502 are mounted on each bobbin shaft 504 of the bobbin cassette 500. The terminal end of the collector wire 16 which is wound on a bobbin 502a will be unwound first and the initial end of the collector wire 16 which is wound on a second bobbin 502b are connected to each other by welding or the like, as shown by arrow G in FIG. 15A. In FIG. 15A, the bobbin 502a is arranged in contact with the surface of the vertical member 506, and the bobbin 502b is arranged to be remote from the surface of the vertical member 506.

From this state, when the wiring operation is continued, both of the two bobbins 502 mounted on any one bobbin shaft 504 become empty. At this time, in each of the remaining forty-one bobbin shafts 504 other than this empty bobbin shaft, a small amount of collector wire 16 is left on the second bobbin 502b, as shown in FIG. 15B. In this case, according to this embodiment, two new bobbins are mounted on a bobbin shaft having two empty bobbins. In the remaining forty-one bobbin shafts that are in the state as shown in FIG. 15B, only one bobbin 502a which is empty is removed, and one new bobbin 502c is mounted, as shown in FIG. 15C. The terminal end of the collector wire 16 wound on the bobbin 502b and the initial end of the collector wire 16 wound on the new bobbin 502c are connected to each other by welding or the like, as indicated by arrow H in FIG. 15C. The terminal end of the collector wire 16 wound on the bobbin 502b and the initial end of the collector wire 16 wound on the new bobbin 502c are drawn in advance from the respective bobbins. After this, when any one bobbin shaft 504 becomes empty, two new bobbins are mounted on this empty bobbin shaft 504 and one new bobbin is replenished at each of the remaining forty-one bobbin shafts 504, as shown in FIGS. 15D and 15E. These operations are repeated.

In this manner, when any of the forty-two bobbin shafts becomes empty, two new bobbins are mounted on the empty bobbin shaft and one new bobbin is mounted on each of the remaining forty-one bobbin shafts. Thus, at least one new bobbin is mounted on each of all the bobbin shafts 504 of the bobbin cassette 500, and the bobbin exchange cycle becomes substantially equal to time spent until one bobbin becomes empty. Since one bobbin takes about one day to become empty, it suffices if bobbin exchange is performed about once a day, thereby preventing a decrease in productivity. Also, a small amount of collector wire left on each bobbin can be prevented from being discharged wastefully. To detect a discontinuity after a wire drawn from the bobbin runs out and a tension applied to the wire disappears and to detect a discontinuity after a wire becomes discontinuous in a step before the wire press member 516, the same procedure is performed. The bobbin cassette 500 is removed, another bobbin cassette 500 which is prepared in advance by a separate procedure is connected, and the operation is resumed. The removed bobbin cassette 500 is repaired by a separate procedure. To prepare for wire discontinuity, a bobbin is set by wire setting, in the same manner as in preparation for a case wherein the bobbin becomes empty. Then, time-consuming bobbin exchange will not be reflected on the stop time of the apparatus, thereby preventing a decrease in productivity.

In the actual process, assume that a wire runs out, a wire becomes discontinuous in a step before the wire press member 516, or a wire becomes discontinuous in a step after the wire press member 516. In this case, discontinuity is detected after tension of the wire disappears. The operator takes a countermeasure in accordance with whether an abnormality occurs before or after the wire press member 516. Restoration of the continuity which occurs in a step after the wire press member 516 is described above. Abnormalities which occur in a step before the wire press member 516 may be classified into a case wherein a wire runs out and a case wherein a wire becomes discontinuous (i.e., breaks). These two cases can be dealt with in the same manner.

In the separate procedure of the bobbin cassette 500, when a discontinuity is detected, the collector wires 16 are pressed by the wire press member 516. Thus, wires other than the discontinuous one can maintain their initial state. In this state, the wires 16 are cut at the position shown in FIG. 14A, and the following portions of the wires are discarded. Thereafter, the bobbin cassette 500 is separated and moved to another location. A discontinuous (broken) wire or an empty bobbin is repaired. As the wire press member 516 presses the collector wires 16 independently of each other with a spring force, after the repaired wire is set by pushing the spring of the wire press member 516 upward with a finger, the set wire is cut at a predetermined position. Thus, all the wires in the bobbin cassette are restored to the normal state. Thereafter, the restoring gripper 200 is set in the manner as described above to clamp the wires. The separate procedure is thus completed. In bobbin cassette exchange, a bobbin cassette which is set in this state is connected to the main body. After this, the same operations as in FIGS. 14B and 14C and 14D are performed.

As described above, according to the above embodiment, since two bobbins are mounted on one bobbin shaft, the collector wires will not be wasted, and a decrease in productivity can be prevented.

Since a plurality of collector wires are temporarily set on the slab at once, wiring of the collector wires on the slab can be performed within a short period of time.

Since the movable finger of the gripper that grips the collector wires is elastically attached to the driving source, variations in spacing or outer diameter of the collector wires can be coped with flexibly.

Since the step rollers drop because of gravity when a collector wire becomes discontinuous, wire discontinuity can be detected easily.

When a collector wire becomes discontinuous, the slack removing portion, the step rollers, the rear end press member, the cutter, and the like are moved upward so that they are positioned away from the collector wire. Thus, a restoring operation which is needed when a collector wire is discontinuous can be performed easily.

When cutting a collector wire, the blades of the cutter are temporarily moved down to a position where they do not contact the collector wires. Thereafter, the blades are shifted to a position where they substantially contact the collector wires. Thus, the collector wires can be simultaneously cut without being bent.

Second Embodiment

The second embodiment is a case wherein the wiring apparatus of the present invention is applied to the manufacture of a solar cell. In the first embodiment, an apparatus for temporarily fixing the collector wires 16 on the slab 12 has been described. In contrast to this, the wiring apparatus of the second embodiment also performs the step of fixing collector wires 16 on a slab 12 by bonding. Many portions of the apparatus of the second embodiment are common to those of the first embodiment. Thus, those portions having the same function will be denoted by the same reference numerals and a detailed description thereof will be omitted.

The solar cell manufacturing process will be described again although it will partly overlap the content described in the first embodiment. In the manufacture of the solar cell, an Al/Zno lower reflecting layer, an n/i/p type amorphous silicon semiconductor layer, and an ITO transparent conductive layer, for converting light into electricity are formed on a stainless steel substrate having a thickness of, e.g., about 0.1 mm and a predetermined area. A large number of collector wires for collecting electrical charges generated by the semiconductor film are fixed by thermal bonding or the like on the stainless steel substrate (to be referred to as a slab hereinafter) on which these films have been formed. As the collector wire, a copper wire coated with a conductive film, e.g., a carbon coating, is used. A solar cell of this construction is generally called a solar cell of the wire collector type. The wiring apparatus of this embodiment performs an operation of fixing, by thermal bonding or the like, collector wires on the slab on which the above films have been formed.

Figure 20:
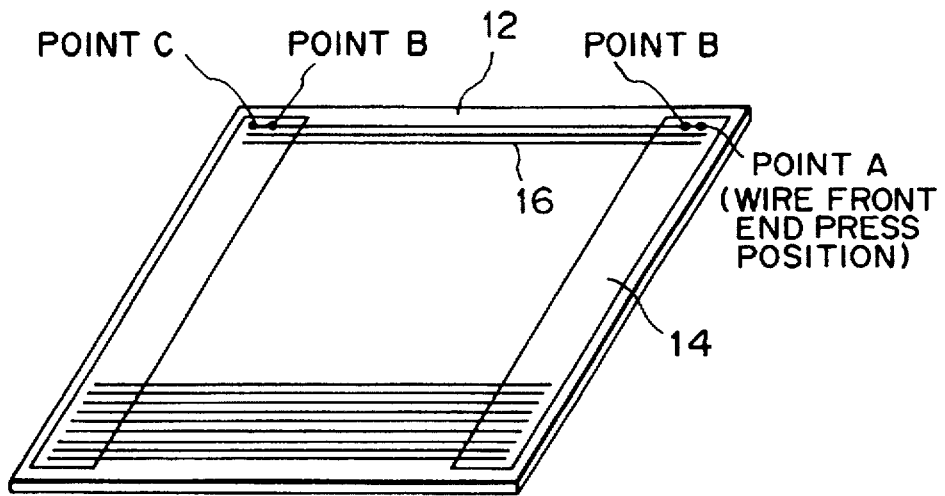
FIG. 20 is a perspective view showing a workpiece.

FIG. 20 is a perspective view showing the slab 12. Copper foils 14 serving as collector electrodes are adhered to the two end portions of the square slab 12 with double-coated tape (not shown), and the collector wires 16 are extended and fixed between the copper foils 14. Referring to FIG. 20, point A is a position where the collector wire 16 is temporarily fixed onto the slab 12 with a front end press member (to be described later), point B is a position where the collector wire is temporarily fixed onto the slab 12 with a rear end press member, and positions between points A and B are where the collector wire 16 is thermally bonded to the slab 12. Point C is a position where the collector wire 16 is cut with a wire cutter (to be described later).

Figure 21:
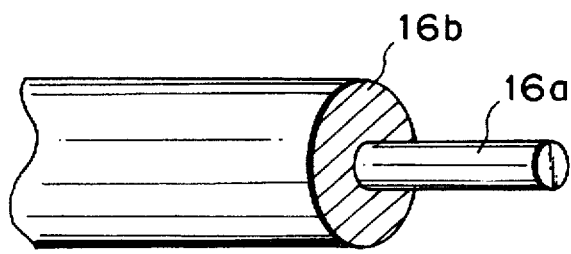
FIG. 21 is a view showing the structure of a collector wire.

FIG. 21 shows the structure of a collector wire 16. For example, a copper wire 16a having a diameter of about 0.1 mm is coated with a conductive resin member 16b (copper paste, silver paste, or the like) having a thickness of about 0.02 mm to constitute the collector wire 16.

Figure 24:
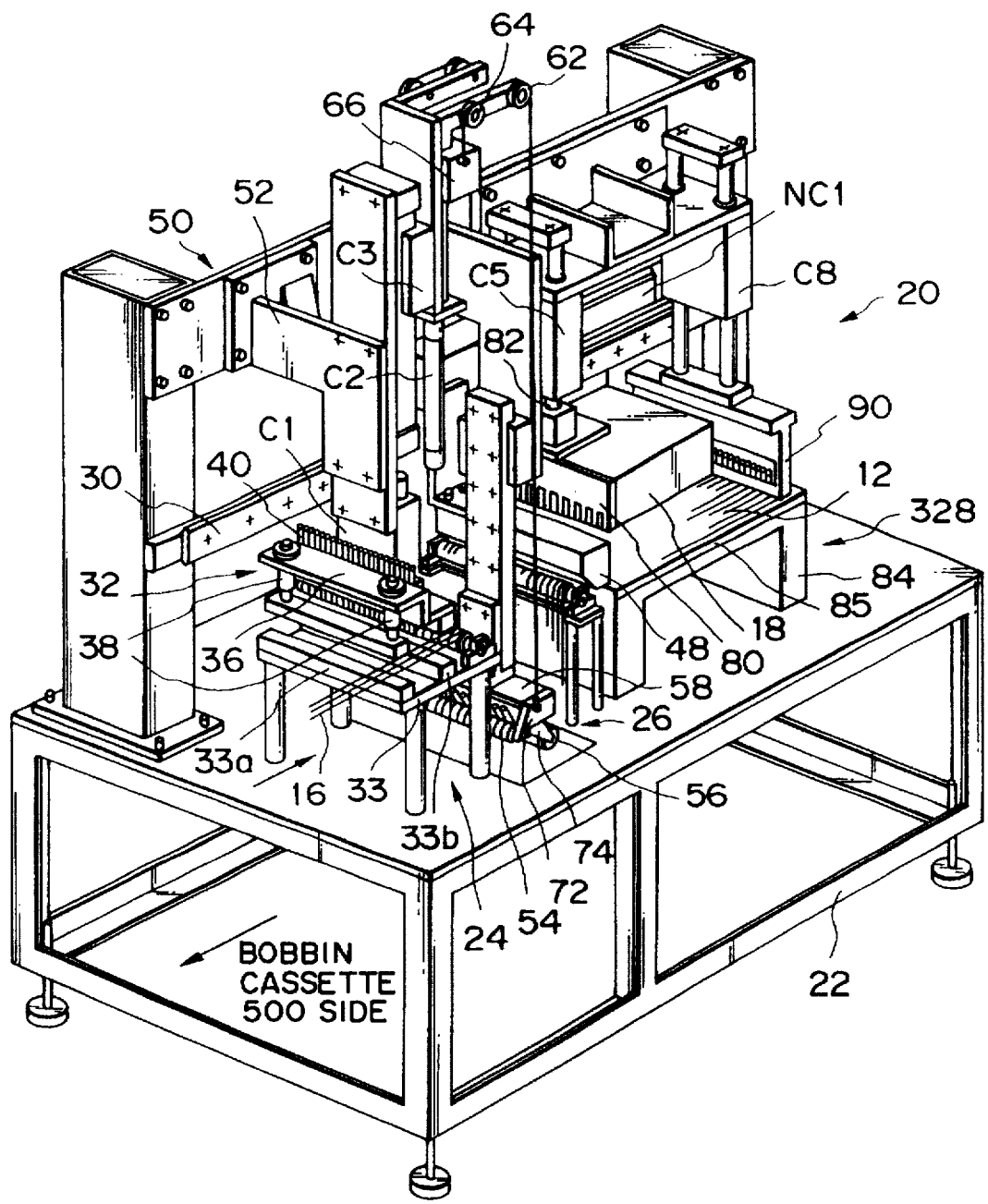
FIG. 24 is a perspective view showing the overall arrangement of a wiring apparatus.

FIG. 22 schematically shows how the collector wires 16 are thermally bonded. As shown in FIG. 24, the slab 12 above which the collector wires 16 are extended is placed on a table 84, and a heater plate 18 is urged against the slab 12 from above to thermally bond the collector wires 16 to the slab 12. The heater plate 18 performs bonding by heating the conductive resin member 16b formed on the collector wires 16 at a temperature of, e.g., about 250° for 5 seconds.

Figure 23:
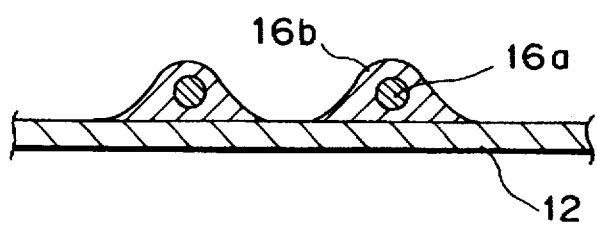
FIG. 23 is a sectional view showing the collector wires that are thermally bonded.

FIG. 23 shows the state wherein the collector wires 16 are bonded to the slab 12. The conductive resin member 16b is melted to attach to the slab 12.

In the slab 12 on which the collector wires 16 are fixed in the above manner, electrical charges generated in the slab 12 (cell surface of the solar cell) are collected by the copper wires 16a through the conductive resin members 16b of the collector wires 16 and then supplied to the copper foils 14.

The arrangement of the wiring apparatus of this embodiment will now be described.

Figure 25:
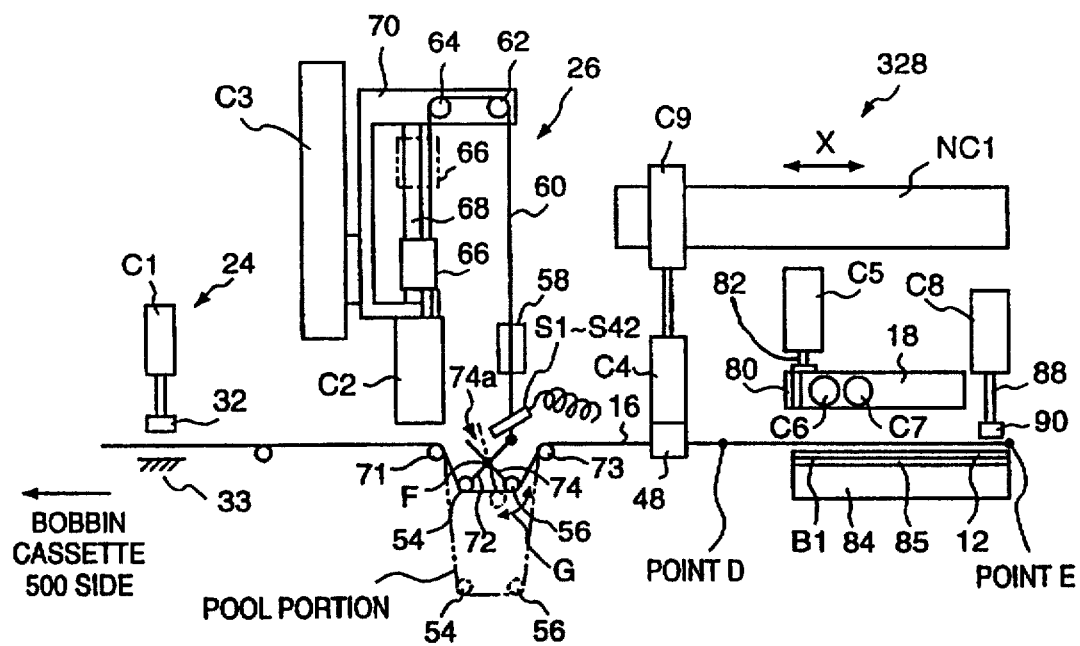
FIG. 25 is a side view schematically showing the arrangement of a slack removing mechanism, a step roller mechanism, and an extending mechanism shown in FIG. 26.

FIG. 24 is a perspective view showing the overall arrangement of the wiring apparatus of the second embodiment, and FIG. 25 is a side view schematically showing the arrangement of a slack removing mechanism 24, a step roller mechanism 26, and an extending mechanism 328 shown in FIG. 24. This wiring apparatus fixes forty-two collector wires 16 on the 300-mm square slab 12 at a pitch of 5 mm.

Referring to FIG. 24, the slack removing mechanism 24, the step roller mechanism 26, and the extending mechanism 328 are arranged on a frame 22 installed on the floor of a factory or the like in this manner from the front side in the drawing. The slack removing mechanism 24 removes the slack in the collector wires 16 when the forty-two collector wires 16 drawn from a bobbin cassette 500 are supplied to the slab 12. The step roller mechanism 26 applies tension to the collector wires 16 fed from the slack removing mechanism 24. The extending mechanism 328 extends the collector wires 16, to which tension has been applied by the step roller mechanism 26, above the slab 12.

The bobbin cassette 500 has eighty-four bobbins 502 on which the collector wires 16 are wound independently, as shown in FIG. 3 described in the first embodiment. The bobbin cassette 500 is connected to the front side in the drawing of the frame 22. The bobbin cassette 500 has forty-two bobbin shafts 504 for rotatably supporting the bobbins 502. Two bobbins 502 are mounted on each bobbin shaft 504.

The arrangement and operation of the bobbin cassette 500, the slack removing mechanism 24, and the step roller mechanism 26 are identical to those of the first embodiment, and a detailed description thereof will be omitted.

The arrangement of the extending mechanism 328 will be described with reference to FIGS. 24 and 25.

The extending mechanism 328 is mainly constituted by the gripper 48, an air cylinder C9, an NC robot NC1, an air cylinder C8, the heater plate 18, an air cylinder C5, a cutter 80, a table 84, and a silicone rubber member 85. The gripper 48 grips the collector wires 16. The air cylinder C9 drives the gripper 48 in the vertical direction. The NC robot NC1 moves the gripper 48 from the rear end portion side (point D) to the front end portion side (point E) of the slab 12 together with the air cylinder C9 to extend them above the slab 12. The air cylinder C8 urges the collector wires 16 extended above the slab 12 against the slab 12. The heater plate 18 urges the collector wires 16 on the slab 12 while heating them. The air cylinder C5 drives heater plate 18 in the vertical direction. The cutter 80 is provided at the rear end portion of the heater plate 18 to cut the trailing end portions of the extended collector wires 16. The table 84 supports the slab 12. The silicone rubber member 85 is adhered on the table 84 to improve the adhesion properties between the heater plate 18 and the slab 12. The arrangement of the gripper 48 is the same as that of the first embodiment.

The heater plate 18 for urging the collector wires 16 against the slab 12, and the cutter 80 are fixed to the distal end portion of a piston rod 82 of the air cylinder C5. Accordingly, the heater plate 18 and the cutter 80 are integrally moved by the air cylinder C5 in the vertical direction. The cutter 80 has a stationary blade and a movable blade. The movable blade is slid by an air cylinder C6 with respect to the stationary blade to cut the collector wires 16. After the stationary blade is temporarily moved downward among the forty-two collector wires 16, its position is finely adjusted by an air cylinder C7. This operation is identical to that described in the first embodiment. A front end press member 90 for urging the leading end portions of the collector wires 16 against the upper surface of the front end portion of the slab 12 is fixed to the distal end of a piston rod 88 of the air cylinder C8. Furthermore, the table 84 holds the slab 12 by vacuum with a suction mechanism B1.

As shown in FIG. 24, the NC robot NC1 and the air cylinders C5 and C8 are fixed to a support frame 50 mounted on the frame 22. The table 84 is fixed on the frame 22.

The arrangement of the cutter 80 will be described with reference to FIG. 26.

Figure 26:
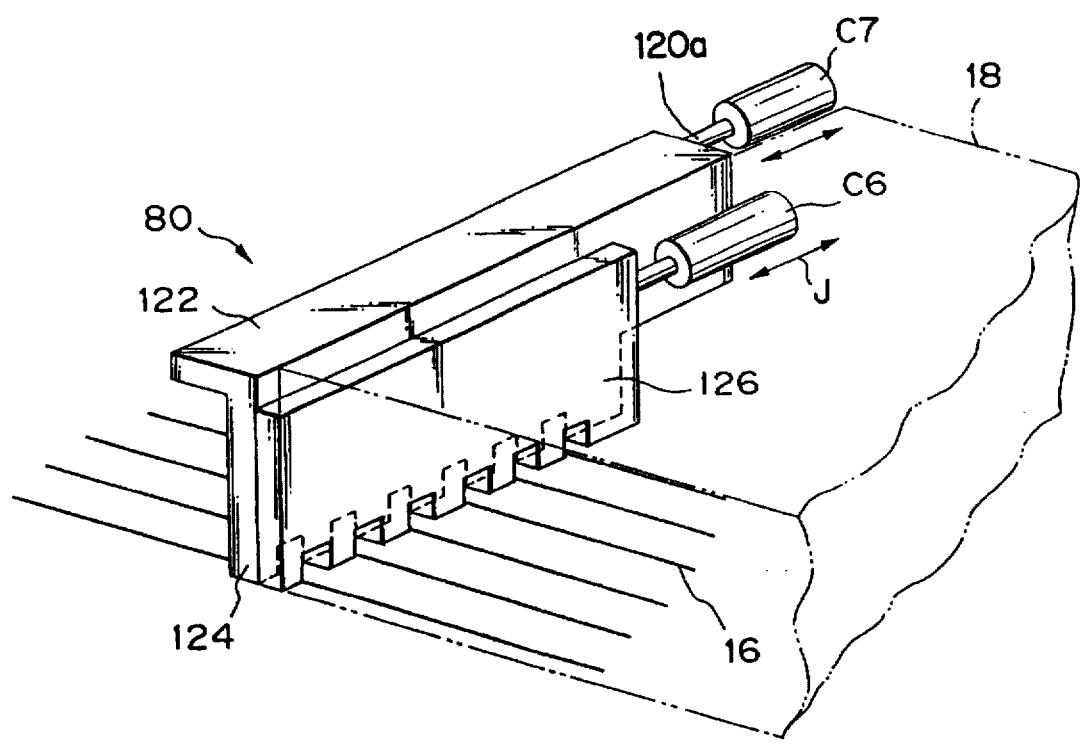
FIG. 26 is a perspective view showing the arrangement of a cutter.

FIG. 26 is a perspective view showing the arrangement of the cutter 80. Referring to FIG. 26, the cutter 80 is mainly constituted by the air cylinder C7, cutting body 122, stationary blade 124, movable blade 126, and air cylinder C6. The air cylinder C7 is fixed to the piston rod 82 of the air cylinder C5 shown in FIG. 25. The cutter body 122 is fixed to a piston rod 120a of the air cylinder C7. The stationary blade 124 is formed at the lower portion of the cutter body 122. The movable blade 126 is attached to the cutter body 122 to be slidable in the horizontal direction. The air cylinder C6 serves as a driving source to slide the movable blade 126 with respect to the stationary blade 124.

The stationary blade 124 is integrally formed at the lower portion of the cutter body 122 having a substantially L-shaped section. The stationary blade 124 is formed into comb teeth having forty-two notches, as indicated by a broken line in FIG. 26, so that its teeth enter the gaps between the forty-two collector wires 16. The movable blade 126 is supported to be slidable in the direction of arrow J in FIG. 26 such that it will not drop from the cutter body 122. The lower portion of the movable blade 126 is formed into a comb teeth having forty-two notches, in the same manner as the stationary blade 124. The width of each of the stationary and movable blades corresponding to the comb teeth is set to be smaller than the spacing of the forty-two collector wires 16, i.e., to be smaller than 5 mm. When the forty-two collector wires 16 are inserted in the notches of the stationary blade 124 and the movable blade 126 and the movable blade 126 is slid by the air cylinder C6 fixed to the cutter body 122, the cutter 80 can sandwich and cut the collector wires 16. The air cylinder C7 moves the entire stationary blade 124 relative to the forty-two collector wires 16. The cutting operation of the cutter 80 is identical to that described in the first embodiment.

The wiring operation of the wiring apparatus having the above arrangement will be described with reference to FIGS. 27A to 27E.

Figure 27A:
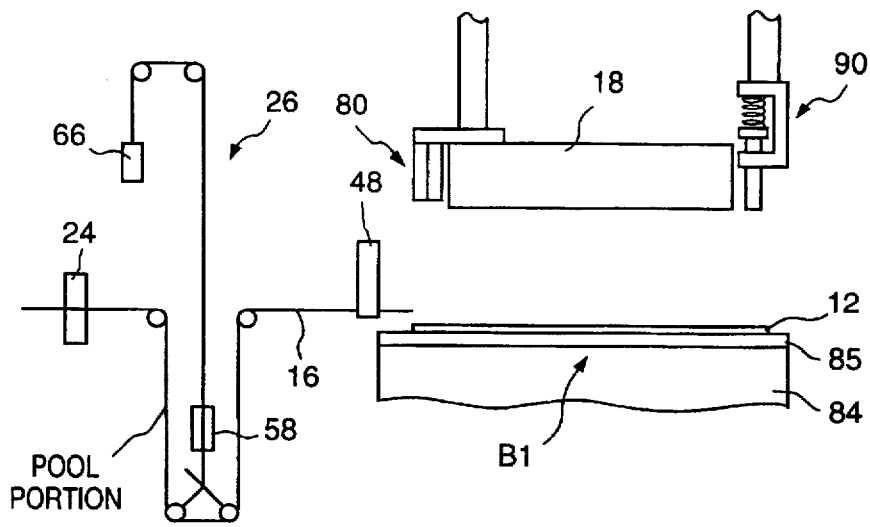
FIGS. 27A to 27E are views for explaining the wiring operation of the wiring apparatus.

As a preparatory step for starting the wiring operation, as shown in FIG. 27A, the collector wires 16 are unwound from the bobbins 502 to be gripped by the gripper 48 and are pooled in the step roller mechanism 26 portion. The slack in the collector wires 16 between the slack removing mechanism 24 and the gripper 48 is removed by the slack removing mechanism 24. Note that the leading ends of the collector wires 16 are gripped by the gripper 48 as they project about 10 mm from the gripper 48.

Thereafter, the slab 12 is supplied onto the table 84, and the slab 12 is held on the table 84 by vacuum with the suction mechanism B1. The NC robot NC1 is actuated to move the gripper 48 forward, thereby feeding the leading ends of the collector wires 16 to the front end portion of the slab 12. At this time, since the slack removing mechanism 24 is kept closed, the collector wires 16 are clamped by the slack removing mechanism 24 portion. As the gripper 48 is moved forward, the pool amount of the collector wires 16 at the step roller mechanism 26 is decreased gradually. As the pool amount is decreased, the collector wires 16 push weight 58 upward. Therefore, a weight corresponding to the weight difference between the weight 58 and balance weight 66 acts on the collector wires 16, thereby applying a predetermined tension to the collector wires 16. Thus, the collector wires 16 are extended taut above the slab 12.

Figure 27B:
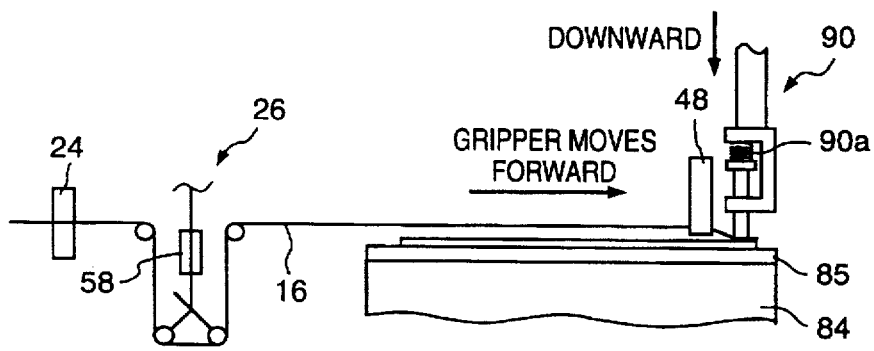
Figure 27C:
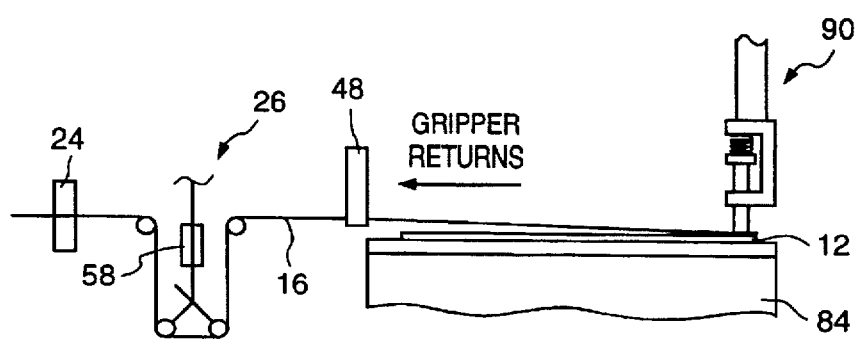

When the leading ends of the collector wires 16 are fed to the front end portion of the slab 12 by the gripper 48, the air cylinder C8 is actuated to urge the distal ends of the collector wires 16 on the slab 12 with a 50- to 100-g spring force of a spring 90a of the front end press member 90, as shown in FIG. 27B (temporary fixing). While the leading ends of the collector wires 16 are urged against the slab 12 with the front end press member 90, an air cylinder C4 is actuated to open the gripper 48. Then, the NC robot NC1 is actuated again to move the gripper 48 backward to the initial position, as shown in FIG. 27C.

Figure 27D:
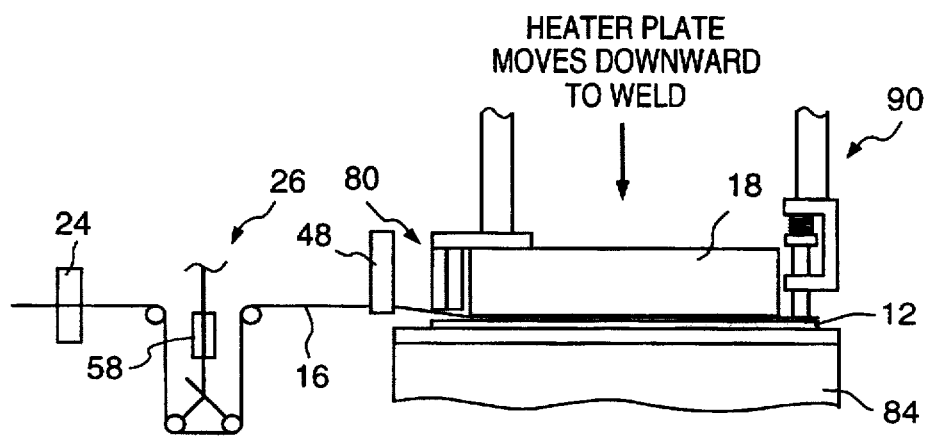

Subsequently, the air cylinder C5 is actuated to integrally move the heater plate 18 and the cutter 80 downward, as shown in FIG. 27D. Thus, the collector wires 16 are urged onto the slab 12 by the heater plate 18. The stationary blade 124 and movable blade 126 of the cutter 80 enter the gaps between the collector wires 16, as shown in FIG. 11A.

When the downward movement of the heater plate 18 and the cutter 80 end, the heater plate 18 heats the collector wires 16 at, e.g., 250° C. for 5 seconds to bond them to the slab 12.

During this bonding operation, the air cylinder C4 is actuated to prepare for cutting the collector wires 16. The gripper 48 is closed to clamp the collector wires 16. The air cylinder C7 is actuated to shift the stationary blade 124 and movable blade 126 of the cutter 80 to a position where they substantially contact the collector wires 16, as shown in FIG. 11B. Then, the air cylinder C6 is actuated to cut the collector wires 16.

Figure 27E:
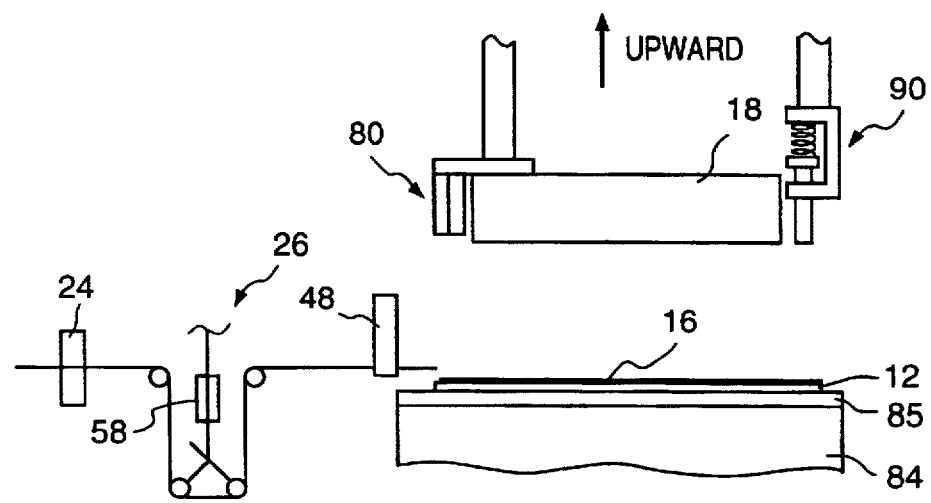

When the bonding and cutting operations of the collector wires 16 are ended, the air cylinders C5 and C8 are actuated to move the front end press member 90, the heater plate 18, and the cutter 80 upward, as shown in FIG. 27E.

Thus, a workpiece 12 on which the plurality of collector wires 16 are fixed parallel to each other is completed. The overall operation of the wiring apparatus of the second embodiment has thus been described.

Third Embodiment

When a wiring apparatus according to the third embodiment is compared with that of the second embodiment, they are different only in the extending mechanism 328 (denoted by reference numeral 310 in this embodiment) portion and the remaining portions are identical. Therefore, the same portions are denoted by the same reference numerals, and a detailed description thereof will be omitted.

FIGS. 28A to 28E show the arrangement and operation of an extending mechanism 310 in the wiring apparatus of the third embodiment. In the wiring apparatus of the third embodiment, cutters 312 and 314 are arranged on the two sides of a heater plate 18, as shown in FIGS. 28A to 28E. An additional gripper 316 is arranged between a table 84 and a step roller mechanism 26. The additional gripper 316 opened or closed by an air cylinder C11. The additional gripper 316 is moved by an air cylinder C10 in the vertical direction. Except for these items, the arrangement of the third embodiment is the same as that of the second embodiment. Note that the structure of the cutters 312 and 314 is the same as that of the second embodiment shown in FIG. 26, and the structure of the additional gripper 316 is the same as that of the gripper 48.

The operation of the wiring apparatus of the third embodiment having the above arrangement will now be described.

Figure 28A:
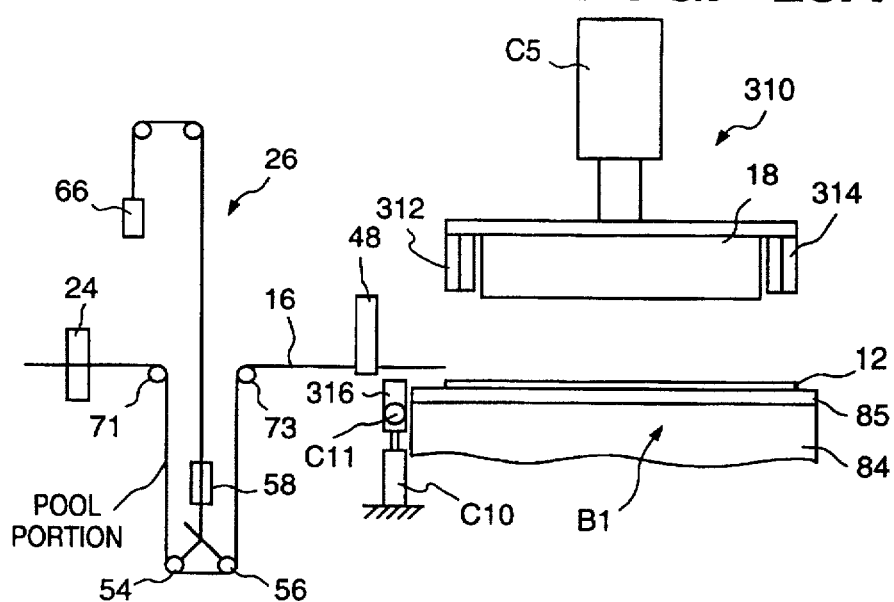
FIGS. 28A to 28G are views for explaining the arrangement and operation of a wiring apparatus according to the third embodiment.

As a preparatory step for starting the wiring operation, as shown in FIG. 28A, collector wires 16 are unwound from bobbins 502 to be gripped by a gripper 48 and are pooled in the step roller mechanism 26 portion. The slack of the collector wires 16 between the slack removing mechanism 24 and the gripper 48 is removed by a slack removing mechanism 24.

Thereafter, a slab 12 is supplied onto the table 84, and the slab 12 is fixed on the table 84 by vacuum by means of a suction mechanism B1. An NC robot NC1 is actuated to move the gripper 48 forward, thereby feeding the leading ends of the collector wires 16 until they pass the front end portion of the slab 12. At this time, since the slack removing mechanism 24 is kept closed, the collector wires 16 are clamped by the slack removing mechanism 24 portion. As the gripper 48 is moved forward, the pool amount of the collector wires 16 at the step roller mechanism 26 is decreased gradually. As the pool amount is decreased, the collector wires 16 push a weight 58 upward. Therefore, a weight corresponding to the weight difference between the weight 58 and a balance weight 66 acts on the collector wires 16, thereby applying a predetermined tension to the collector wires 16. Thus, the collector wires 16 are extended taut above the slab 12.

Figure 28B:
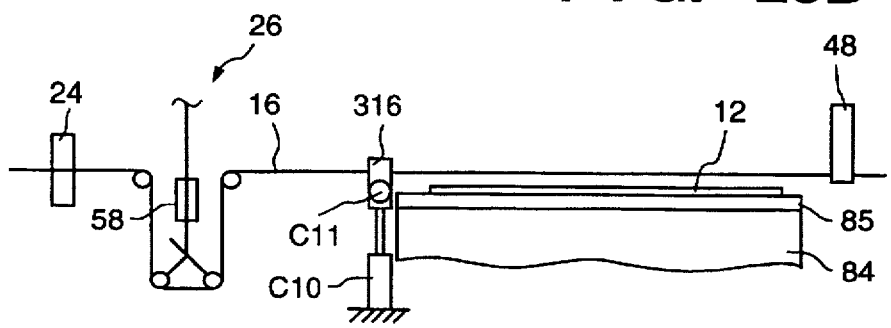

When the leading ends of the collector wires 16 are fed by the gripper 48 until they pass the front end portion of the slab 12, the air cylinder C10 is actuated as shown in FIG. 28B to move the additional gripper 316 upward to a position where it can grip the collector wires 16. Furthermore, then, the air cylinder C11 is actuated to grip the collector wires 16 with the spare gripper 316. Therefore, the collector wires 16 are gripped by the gripper 48 and the additional gripper 316 on the two sides of the slab 12.

Figure 28C:
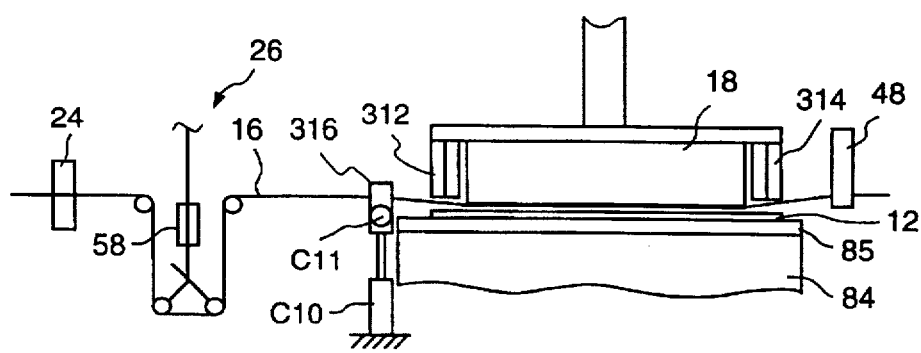

At this time, an air cylinder C5 is actuated to integrally move the heater plate 18 and the cutters 312 and 314 downward, as shown in FIG. 28C. Thus, the collector wires 16 are urged onto the slab 12 by the heater plate 18. The heater plate 18 heats the collector wires 16 at, e.g., 250° C. for 5 seconds to bond them to the slab 12.

During this bonding operation, the cutters 312 and 314 are actuated to cut the collector wires 16 on the two sides of the heater plate 18.

Figure 28D:
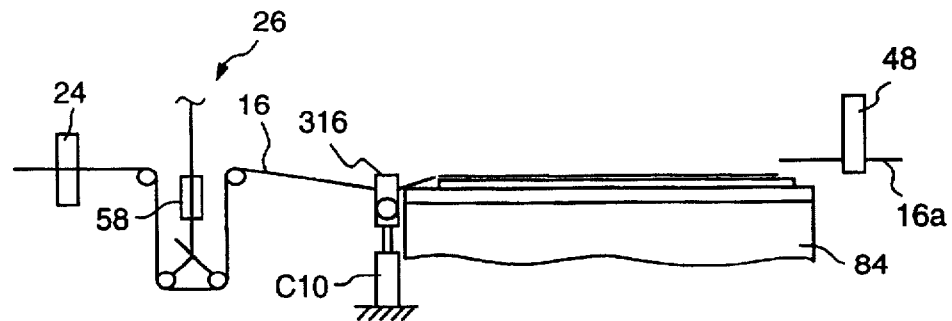

When the bonding and cutting operations of the collector wires 16 end, the air cylinder C5 is actuated to move the heater plate 18 and the cutters 312 and 314 upward, as shown in FIG. 28D. Simultaneously, the gripper 48 is moved to permit extra wires 16a to fall, the air cylinder C10 is actuated to move the additional gripper 316 downward, and the collector wires 16 are retracted from the slab 12.

Figure 28E:
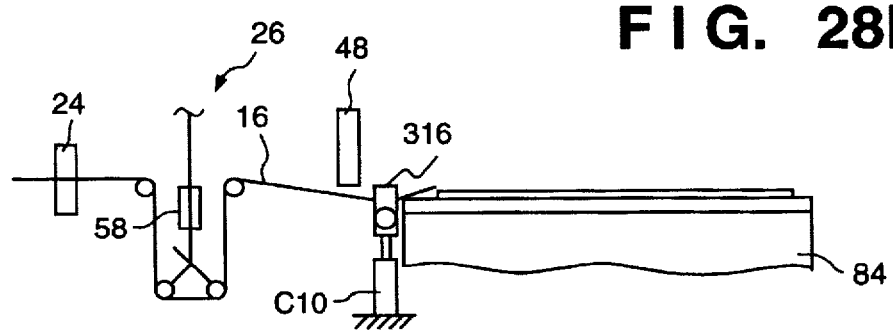
Figure 28F:
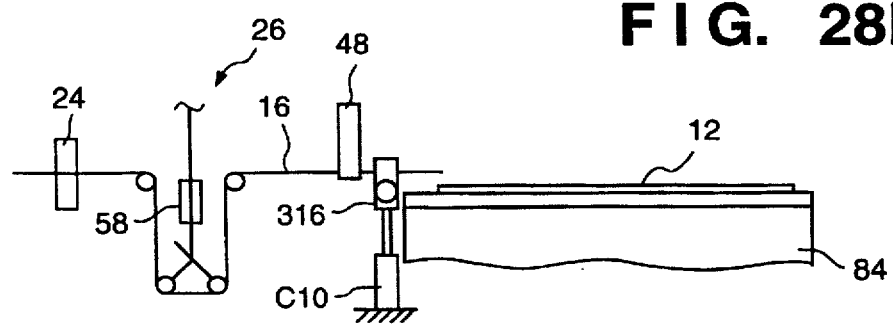
Figure 28G:
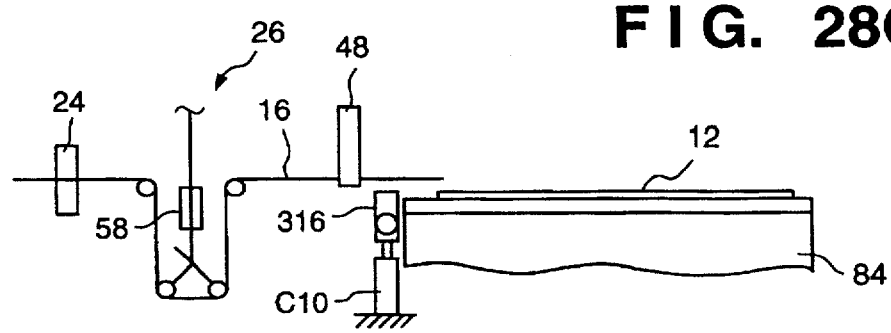

Thus, a workpiece 12 on which a plurality of collector wires 16 are fixed parallel to each other is completed. To prepare for the subsequent wiring operation, the gripper 48 is returned to its initial position, as shown in FIG. 28E, the additional gripper 316 is moved upward, as shown in FIG. 28F to transfer the collector wires 16 to the gripper 48, and then the additional gripper 316 is moved downward, as shown in FIG. 28G, thereby ending a series of wiring operations.

Fourth Embodiment

Figure 29:
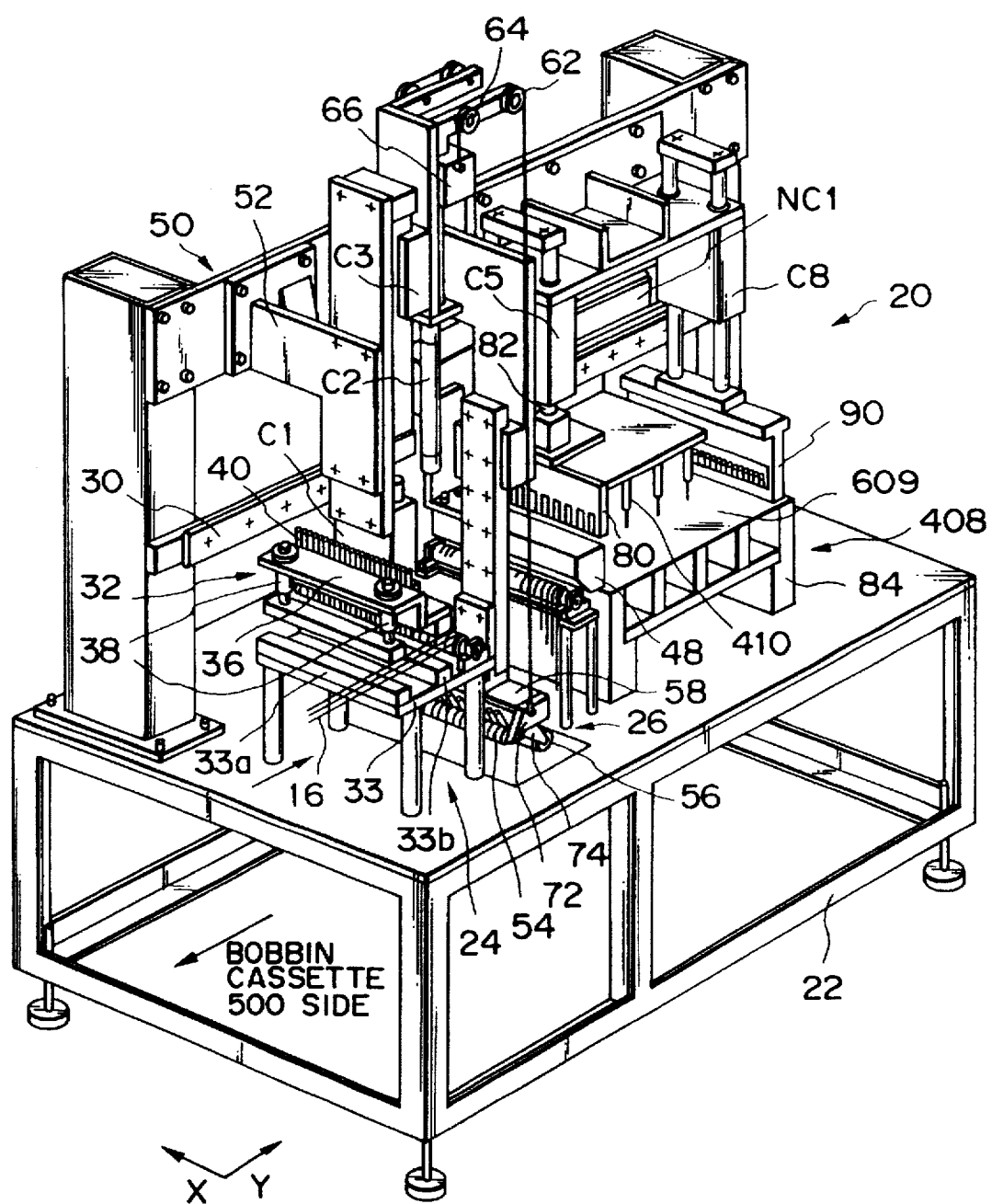
FIG. 29 is a perspective view showing the arrangement of a wiring apparatus according to the fourth embodiment.
Figure 30:
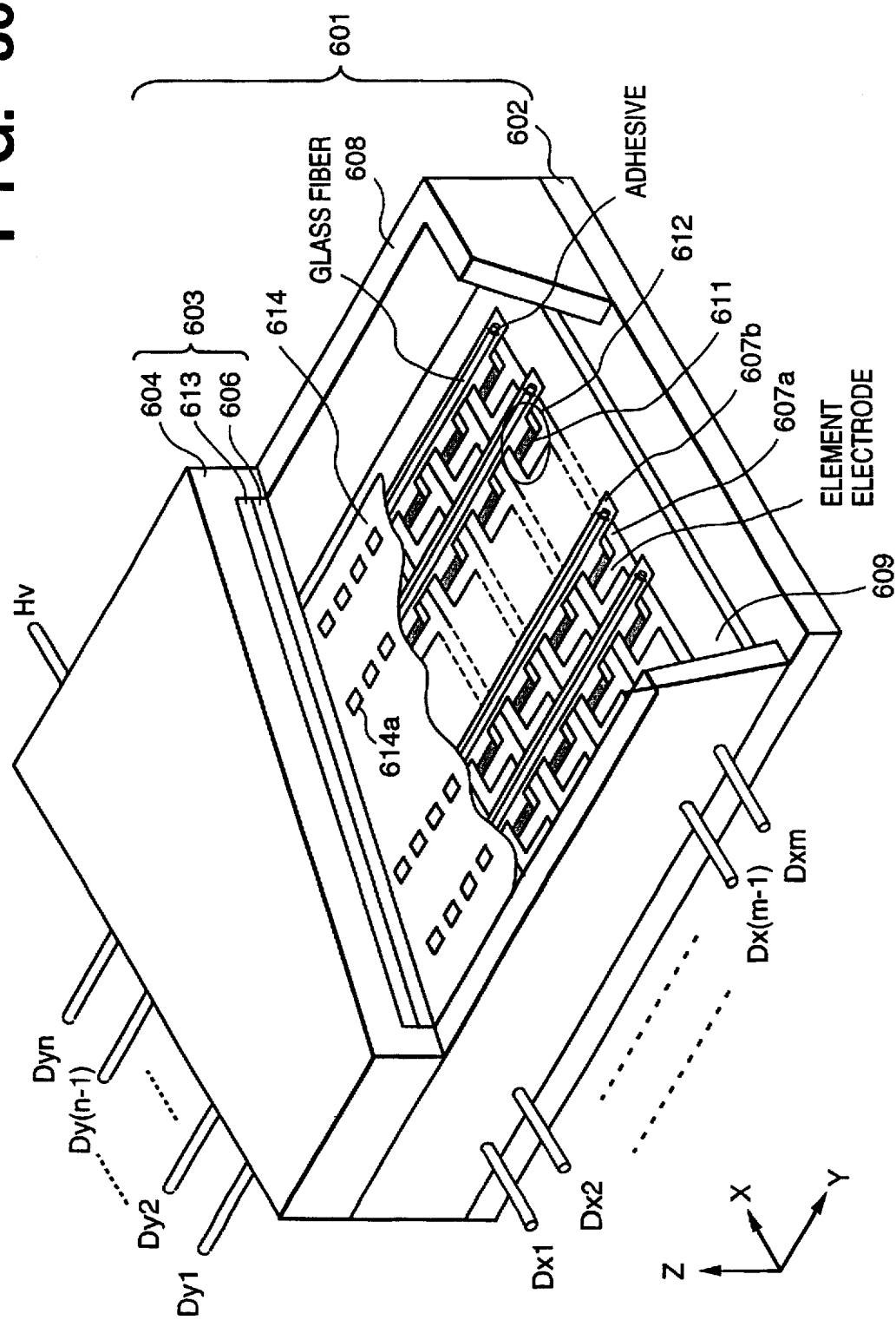
FIG. 30 shows a case wherein glass fibers are disposed on the Y-direction wires of the element source substrate of a flat display which uses surface conductive electron emitting elements.

FIG. 29 shows the arrangement of an apparatus for disposing glass fibers on the Y-direction wires on the substrate of a flat display using surface conductive electron emitting elements (to be referred to as SCE elements hereinafter). FIG. 30 shows an example in which the glass fibers are disposed on the Y-direction wires on the substrate of this flat display.

A flat display using SCE elements will now be described. The SCE elements utilize electron emission which occurs upon flowing a current to a small-area thin film formed on the substrate parallel to the film surface. According to a typical arrangement of the flat display, a pair of element electrodes are formed on an insulating substrate, a metal oxide thin film is formed to connect the electrodes, and the thin film is locally broken in accordance with electric processing called forming. Before and after forming, the thin film is basically made of a fine-particle film.

The SCE elements are non-linear elements in which an emission current is sharply increased upon application of an element voltage equal to or greater than a certain voltage (threshold voltage). When the applied voltage is less than the threshold voltage, substantially no emission current is detected in the SCE elements. The emission current of the SCE elements can be controlled by the element voltage, and the emission charges can be controlled by the time of element voltage application. Various types of display devices are formed by combining an electron source formed by arranging a plurality of SCE elements and an image forming member having phosphors that emit visible light upon reception of electrons emitted by the electron source. Such a display device is expected to be used as an image forming apparatus that replaces the CRT since it is a self-emission device with which a large-screen apparatus can be manufactured comparatively easily and which has an excellent display quality.

Referring to FIG. 30, reference numeral 612 denotes an electron emitting element having an electron emitting portion 611; 602 denotes a rear plate on which the electron emitting elements 612 are fixed; 603 denotes a faceplate which forms a phosphor film 613 and a metal back layer 606 on the inner surface of a glass substrate 604; and 608 denotes a support frame. The support frame 608 seals the rear plate 602 and the faceplate 603 with glass frit to constitute an envelope 601. In FIG. 30, the envelope 601 is constituted by the faceplate 603, the support frame 608, and the rear plate 602, as described above. The rear plate 602 is provided mainly for the purpose of reinforcing an electron source substrate 609. If the electron source substrate 609 itself has a sufficiently high strength, a separate rear plate 602 is not necessary. In this case, the support frame 608 may be directly sealed on the electron source substrate 609, so that an envelope is constituted by the faceplate 603, the support frame 608, and the substrate 609.

On the substrate 609, reference symbol 607a denotes an X interconnection directed in the X-axis direction; 607b, a Y interconnection directed in the Y-axis direction; and 612, the electron emitting element. As the electron emitting element, a planar or vertical SCE is suitably used.

In FIG. 30, a shield plate 614 is arranged 0.2 mm above the electron emitting portions 611. To support the shield plate 614, in this embodiment, glass fibers each having a diameter of 0.2 mm are disposed on the Y interconnections and fixed to them with an adhesive. Windows 614a are formed in the shield plate 614 to correspond to the electron emitting portions 611. A voltage of 5 to 20 kV is applied to the metal back layer 606 (aluminum deposition film) of the faceplate 603 from a high-voltage terminal in order to accelerate the emitted electrons. The shield plate 614 protects the electron source from this voltage.

In the wiring apparatus of this embodiment, 0.2-mm glass fibers are disposed on the Y interconnections on the substrate 609 at an interval of 15 mm and are fixed with an adhesive. Since the Y interconnections are formed at a spacing of, e.g., 0.6 mm, a glass fiber is disposed every 25 Y interconnections. As the size of the flat display is about 10 to 60 inches, the total number of glass fibers to be disposed is about 15 (a length of 200 mm) to 100 (a length of 1,500 mm).

When the wiring apparatus of the fourth embodiment (see FIG. 31) is compared with that of the second embodiment, they are different only in the extending mechanism 328 (denoted by reference numeral 408 in this embodiment) portion and the remaining portions are identical, in the same manner as in the third embodiment. Therefore, these same portions are denoted by the same reference numerals, and a detailed description thereof will be omitted.

In the wiring apparatus of the fourth embodiment, glass fibers 412 are used in place of the collector wires 16, and in place of the heater plate 18, a plurality of dispensers 410 for supplying the adhesive are arranged two-dimensionally in the X and Y directions, as shown in FIGS. 29 and FIGS. 31A to 31E. Fiber fixing rods 414 are disposed at a position adjacent to a cutter 80. The dispensers 410 are disposed at an interval of 15 mm in the X direction, which is the same as the disposing interval of the glass fibers 412, and are disposed at an interval of about 100 mm in the Y direction. Except for these, the arrangement of the fourth embodiment is identical to that of the second embodiment.

The wiring operation of the wiring apparatus having the above arrangement will now be described with references to FIGS. 31A to 31E.

Figure 31A:
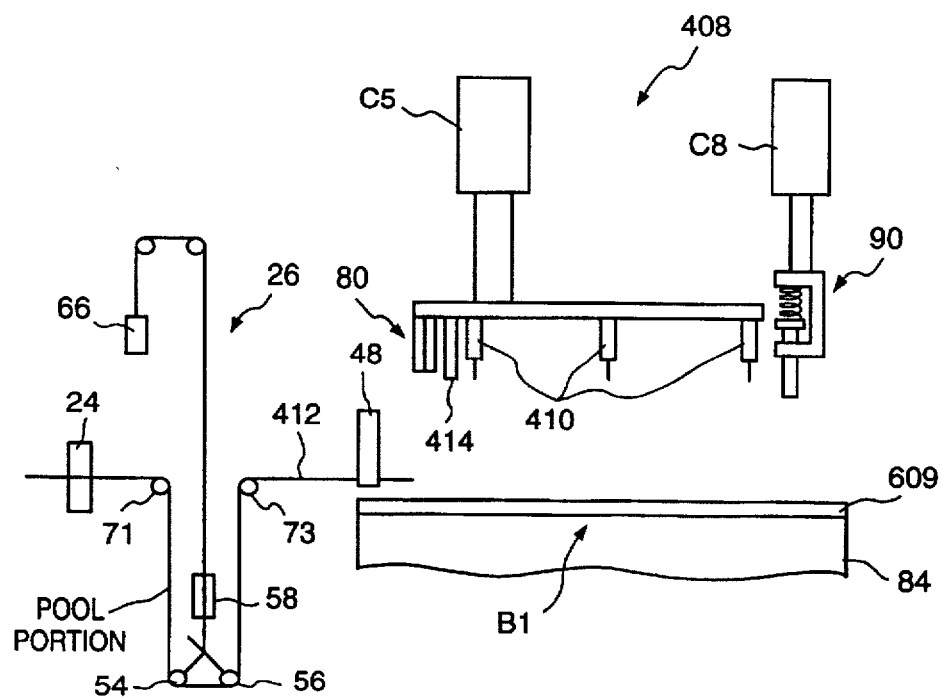
FIGS. 31A to 31E are views for explaining the wiring apparatus according to the fourth embodiment.

As the preparation step for starting the wiring operation, as shown in FIG. 31A, the glass fibers 412 are unwound from bobbins 502 and gripped by a gripper 48 and are pooled in a step roller mechanism 26 portion. The slack of the glass fibers 412 between the slack removing mechanism 24 and the gripper 48 is removed by a slack removing mechanism 24. Note that the distal ends of the glass fibers 412 are gripped by the gripper 48 as they project about 10 mm from the gripper 48.

Thereafter, the electron source substrate 609 is supplied onto a table 84, and the substrate 609 is fixed on the table 84 by vacuum by means of a suction mechanism B1. An NC robot NC1 is actuated to move the gripper 48 forward, thereby feeding the leading ends of the glass fibers 412 to the front end portion of the electron source substrate 609. At this time, since the slack removing mechanism 24 is kept closed, the glass fibers 412 are clamped by the slack removing mechanism 24 portion. As the gripper 48 is moved forward, the pool amount of the glass fibers 412 at the step roller mechanism 26 is decreased gradually. As the pool amount is decreased, the glass fibers 412 push a weight 58 upward. Therefore, a weight corresponding to the weight difference between the weight 58 and a balance weight 66 acts on the glass fibers 412, thereby applying a predetermined tension to the glass fibers 412. Thus, the glass fibers 412 are extended taut above the electron source substrate 609.

Figure 31B:
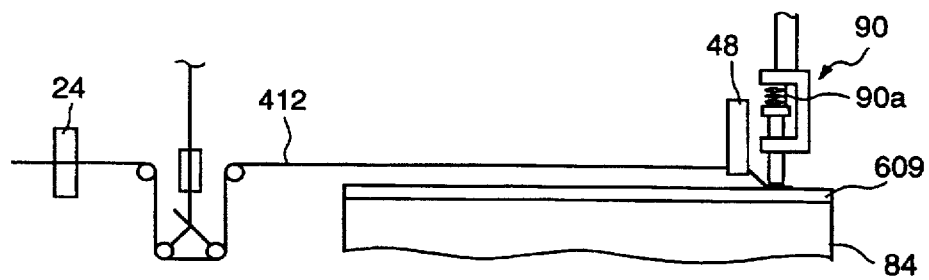
Figure 31C:
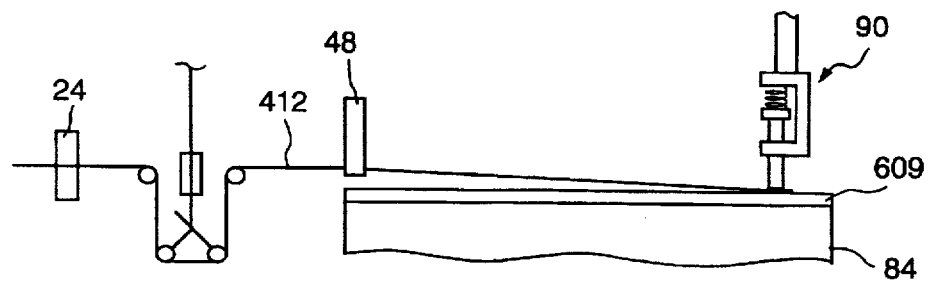

When the leading ends of the glass fibers 412 are fed to the front end portion of the electron source substrate 609 by the gripper 48, an air cylinder C8 is actuated to urge the distal ends of the glass fibers 412 on the electron source substrate 609 with a 50–100-g spring force of a spring 90a of a front end press member 90, as shown in FIG. 31B (temporary fixing). While the leading ends of the glass fibers 412 are urged against the electron source substrate 609 with the front end press member 90, an air cylinder C4 (as shown in FIG. 25) is actuated to open the gripper 48. Then, the NC robot NC1 is actuated again to move the gripper 48 backward to the initial position, as shown in FIG. 31C.

Figure 31D:
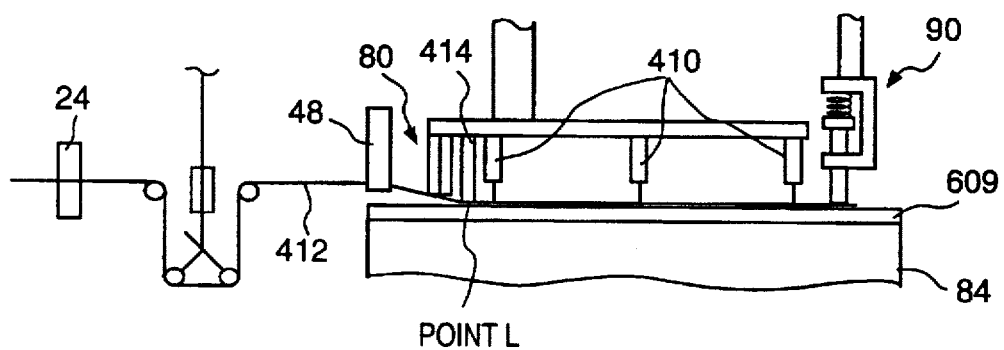

Subsequently, an air cylinder C5 is actuated to integrally move the dispensers 410, the fiber fixing rods 414, and the cutter 80 downward, as shown in FIG. 31D. Thus, the glass fibers 412 are urged onto the electron source substrate 609 by the front end press member 90 and the fiber fixing rods 414.

When the downward movement of the dispensers 410, the fiber fixing rods 414, and the cutter 80 ends, the dispensers 410 supply an adhesive to the glass fibers 412 and the electron source substrate 609 to adhere the former on the later.

During this adhering operation, the cutter 80 is actuated to cut the glass fibers 412.

Figure 31E:
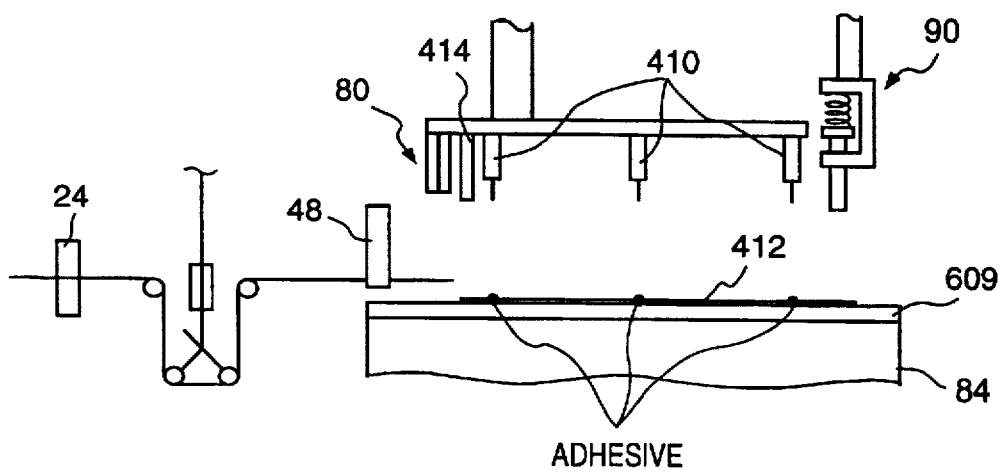

When the adhering and cutting operations of the glass fibers 412 end, the air cylinders C5 and C8 are actuated to move the front end press member 90, the dispensers 410, the fiber fixing rods 414, and the cutter 80 upward, as shown in FIG. 31E.

Thus, the electron source substrate 609 on which the plurality of glass fiber 412 are fixed parallel to each other can be obtained.

The overall operation of the wiring apparatus of the fourth embodiment has thus been described.

Fifth Embodiment

When a wiring apparatus according to the fifth embodiment is compared with that of the fourth embodiment, they are different only in the extending mechanism 408 (denoted by reference numeral 430 in this embodiment) portion and the remaining portions are identical. Therefore, the same portions are denoted by the same reference numerals, and a detailed description thereof will be omitted.

Figure 32:
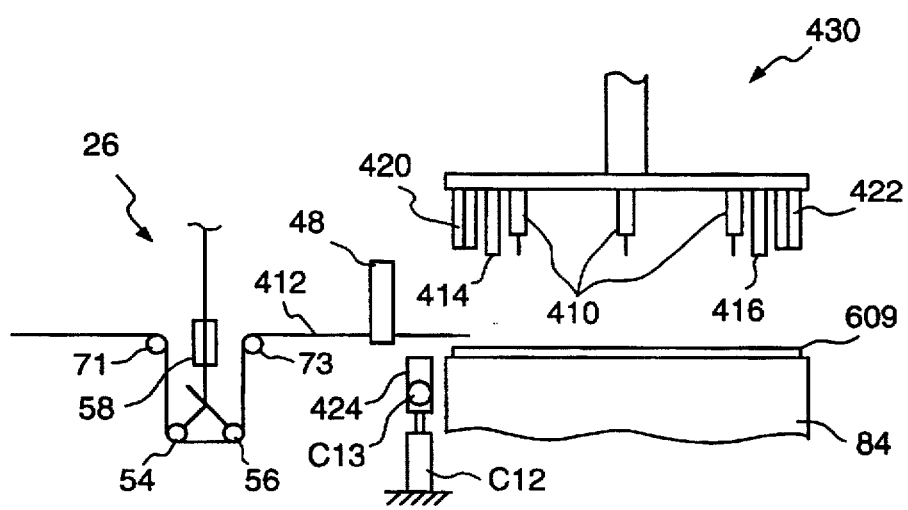
FIG. 32 shows the arrangement of a wiring apparatus according to the fifth embodiment.

FIG. 32 shows the arrangement of the extending mechanism 430 in the wiring apparatus according to the fifth embodiment. In the wiring apparatus of the fifth embodiment, fiber fixing rods 414 and a cutter 420, and fiber fixing rods 416 and a cutter 422 are respectively arranged on the two sides of dispensers 410, as shown in FIG. 32. An additional gripper 424 is arranged between a table 84 and a step roller mechanism 26. The additional gripper 424 is opened or closed by an air cylinder C13. The additional gripper 424 is driven by an air cylinder C12 in the vertical direction. Except for these items, the arrangement of the fifth embodiment is identical to that of the fourth embodiment. The structure of the cutters 420 and 422 is similar to that of the second embodiment shown in FIG. 26, and the structure of the additional gripper 424 is similar to that of the gripper 48. When the wiring operation of the fifth embodiment is compared to that of the third embodiment, the former is different from the latter only in that an adhesive is supplied to glass fibers 412 with the dispensers 410 to fix them, whereas in the latter the collector wires 16 are bonded by the heater plate 18. Except for this, the wiring operation of the fifth embodiment is the same as that of the third embodiment.

As has been described above, according to the second to fifth embodiments of the present invention, a plurality of linear bodies can be simultaneously fixed on a workpiece. Thus, the linear bodies can be wired on the workpiece within a short period of time.

Various changes and modifications may be made without departing from the spirit and scope of the invention.

For example, in the above embodiments, forty-two collector wires are extended above a 300-mm square slab. However, the size of the workpiece and number of wires are merely examples, and the present invention can be applied regardless of the size of the slab and the number of wires, as a matter of course.

In the above description, the collector wires are temporarily fixed on the slab with double-coated tape. However, the present invention is not limited to this, and the collector wires may be adhered with an ultraviolet-curing adhesive or the like.

In the above description, collector wires or glass fibers are disposed as the linear bodies. However, the present invention is not limited to them but can be applied to other equivalents as far as they are extended in a plurality of numbers above a workpiece to be parallel to each other.

The present invention is not limited to the above embodiments and various changes and modifications can be made within the spirit and scope of the present invention. Therefore, to apprise the public of the scope of the present invention the following claim are made.

What is claimed is:

1. A method of providing a plurality of parallel, spaced apart collector wires on a substrate coated with a photosensitive film, comprising the sequential steps of:
   simultaneously holding a leading end portion of each of the plurality of collector wires at a predetermined spacing therebetween before a first end of the substrate;
   simultaneously drawing the plurality of collector wires to a second end of the substrate;
   simultaneously fixing said leading end portion of each of the drawn collector wires on the first end of the substrate, while the collector wires are simultaneously held at the second end of the substrate;
   simultaneously fixing a trailing end portion of each of the collector wires to the first end of the substrate; and thereafter
   simultaneously cutting each of the collector wires at the trailing end portion thereof.

2. The method according to claim 1, further comprising the step of simultaneously removing slack in the plurality of collector wires before the plurality of collector wires are drawn to the second end of the substrate.

3. The method according to claim 1, further comprising the step of simultaneously applying a predetermined tension to the plurality of collector wires before the plurality of collector wires are drawn onto the substrate to be fixed to the second end of the substrate.

4. A method of providing a plurality of parallel-spaced apart collector wires on a solar cell substrate, comprising the sequential steps of:
   simultaneously supplying the plurality of collector wires from a wire storage means to be in parallel spaced relation with each other;
   simultaneously holding the collector wires and simultaneously drawing a leading edge portion of each of the collector wires from a first end to a second end of the substrate at a predetermined spacing therebetween;
   simultaneously removing slack in the drawn collector wires;
   simultaneously applying tension to the collector wires after the slack is removed;
   simultaneously fixing the leading edge portions to the second end of the substrate;
   simultaneously fixing a trailing end portion of each of the collector wires to the first end of the substrate; and
   simultaneously cutting the collector wires at a trailing portion thereof after the tension is applied thereto, wherein
   the drawing step, the slack removing step, the tension applying step, and the cutting step are performed on substantially the same plane, and the supplying step includes the step of switching a direction of a wire moving track when the supplying step is to be shifted to the step of drawing the collector wires from the wire storage means.

5. A solar cell including a substrate, manufactured by a method of providing a plurality of parallel, spaced apart collector wires on a substrate coated with a photosensitive film, said method comprising the sequential steps of:
   simultaneously holding an end of each of the plurality of parallel collector wires at a predetermined spacing therebetween before a first end of the substrate;
   simultaneously drawing the plurality of collector wires that are held to a second end of the substrate;
   simultaneously fixing said end of each of the drawn collector wires on the second end of the substrate, while the collector wires are simultaneously held at the second end of the substrate;
   simultaneously fixing each of the collector wires to the first end of the substrate; and thereafter
   simultaneously cutting each of the collector wires at a trailing portion thereof at an inner portion of am edge of the substrate.

6. A method of extending a predetermined number of spaced apart wires above a predetermined workpiece so as to be parallel to each other, comprising the sequential steps of:
   simultaneously unwinding the predetermined number of wires from bobbins, on which the predetermined number of wires are wound independently of each other, to be parallel to each other and simultaneously gripping leading edge portions of the predetermined number of wires with gripping means;
   simultaneously drawing the predetermined number of wires that are gripped in said unwinding step from a first end portion to a second end portion of the workpiece;
   simultaneously urging the leading end portions of the predetermined number of wires against the second end portion of the workpiece to adhere the leading end portions of the predetermined number of wires to the second end portion of the workpiece;
   simultaneously releasing the leading end portions of the gripped wires and moving the gripping means backward in a direction opposite to a direction in which the predetermined number of wires have been drawn;
   simultaneously urging trailing portions of the predetermined number of wires against the first end portion of the workpiece to adhere the trailing portions of the predetermined number of wires to the first end portion; and
   simultaneously cutting the trailing portions of the predetermined number of wires before the first end portion.

7. The method according to claim 6, wherein said gripping means simultaneously grips the predetermined number of wires at the leading end portions thereof which project about 10 mm in the wire drawing direction.

8. The method according to claim 6, wherein said leading end portions and the trailing portions of the wires are adhered to the second and first end portions, respectively, of the workpiece with double-coated tape.

9. The method according to claim 6, wherein the work is a solar cell substrate having a surface coated with a photo-semiconductor film, and the wires are collector wires that collect charges generated by the photosemiconductor film.

10. A method of disposing a plurality of spaced apart linear bodies on a predetermined workpiece so as to be parallel to each other, comprising the sequential steps of:
   simultaneously supplying the plurality of linear bodies from a storage means that stores the linear bodies arranged parallel to each other;
   simultaneously gripping with gripping means the plurality of linear bodies arranged parallel to each other at portions thereof which are in the vicinity of leading end portions thereof;

simultaneously drawing the plurality of gripped linear bodies from a first end portion to a second end portion of the workpiece;

simultaneously temporarily fixing the plurality of drawn linear bodies at portions thereof which are in the vicinity of the leading end portions with urging means against a portion of the workpiece which is in the vicinity of the second end portion thereof;

releasing the gripping state of the gripping means and returning the gripping means to the first end portion of the workpiece;

simultaneously gripping portions of the linear bodies located at the first end portion of the workpiece with the gripping means;

simultaneously thermally contact-bonding the plurality of linear bodies onto the workpiece with contact bonding means while gripping the plurality of linear bodies;

simultaneously cutting the plurality of linear bodies at positions of the first end portion of the work, said cutting step being performed simultaneously with said contact bonding step; and releasing the contact bonding state set by the contact bonding means and the temporary fixing state set by the urging means.

11. The method according to claim 10, further comprising the step of simultaneously removing slack in the plurality of linear bodies before the plurality of linear bodies are drawn to the second end portion of the workpiece.

12. The method according to claim 10, further comprising the step of simultaneously applying a predetermined tension to the plurality of linear bodies before the plurality of linear bodies are drawn onto the workpiece to be temporarily fixed to the second end portion thereof.

13. The method according to claim 10, wherein the work is a solar cell substrate having a surface coated with a photosemiconductor film, and the linear bodies are collector wires that collect charges generated by the photosemiconductor film.

14. A method of disposing a plurality of spaced apart linear bodies on a predetermined workpiece so as to be parallel to each other, comprising the sequential steps of:

supplying the plurality of linear bodies from a storage means that stores the linear bodies arranged parallel to each other;

simultaneously gripping with gripping means the plurality of linear bodies arranged parallel to each other at portions thereof which are in the vicinity of leading end portions thereof;

simultaneously drawing the plurality of gripped linear bodies from a first end portion of the workpiece to a position beyond a second end portion of the workpiece;

simultaneously thermally contact-bonding portions of the plurality of linear bodies located between a portion in the vicinity of the first end portion of the workpiece and a portion in the vicinity of the second end portion of the workpiece to the workpiece with contact bonding means;

simultaneously cutting portions of the plurality of linear bodies located at the first and second end portions of the workpiece, said cutting step being performed simultaneously with said contact bonding step; and releasing the contact bonding state set by the contact bonding means.

15. The method according to claim 14, further comprising, before said contact bonding step, the step of simultaneously gripping a first end portion side of each of the linear bodies with a second gripping means located in the vicinity of the first end portion of the workpiece.

16. The method according to claim 15, further comprising, after said releasing step, the steps of returning the gripping means from the second end portion to the first end portion of the workpiece and transferring the linear bodies from the second gripping means to the gripping means.

17. The method according to claim 14, further comprising the step of simultaneously removing slack in the plurality of linear bodies before the plurality of linear bodies are drawn to the second end portion of the workpiece.

18. The method according to claim 14, wherein the work is a solar cell substrate having a surface coated with a photosemiconductor film, and the linear bodies are collector wires that collect charges generated by the photosemiconductor film.

19. A method of disposing a plurality of spaced apart linear bodies on a predetermined workpiece so as to be parallel to each other, comprising the sequential steps of:

supplying the plurality of linear bodies from a storage means that stores the linear bodies arranged parallel to each other;

simultaneously gripping with gripping means the plurality of linear bodies arranged parallel to each other at portions thereof which are in the vicinity of leading end portions thereof;

simultaneously drawing the plurality of gripped linear bodies from a first end portion to a second end portion of the workpiece;

temporarily fixing the plurality of drawn linear bodies, at portions thereof which are in the vicinity of the leading end portions thereof with urging means against a portion of the workpiece which is in the vicinity of the second end portion thereof;

releasing the gripping state of the gripping means and returning the gripping means to the first end portion of the workpiece;

simultaneously gripping portions of the linear bodies located at the first end portion of the workpiece with said gripping means again;

simultaneously urging the plurality of linear bodies against the workpiece while gripping the plurality of linear bodies and supplying an adhesive to the plurality of linear bodies and the workpiece by adhesive supplying means, thereby adhering together the plurality of linear bodies and the workpiece;

simultaneously cutting the plurality of linear bodies at positions in the vicinity of the first end portion of said workpiece, said cutting step being performed simultaneously with said adhering step; and withdrawing the adhesive supplying means and the urging means from the workpiece.

20. The method according to claim 19, further comprising simultaneously removing slack in the plurality of linear bodies before the plurality of linear bodies are drawn to the second end portion of the workpiece.

21. The method according to claim 19, further comprising simultaneously applying a predetermined tension to the plurality of linear bodies before the plurality of linear bodies are drawn onto the workpiece to be temporarily fixed to the second end portion of the workpiece.

22. The method according to claim 19, wherein the work is a solar cell substrate having a surface coated with a photosemiconductor film, and the linear bodies are collector wires that collect charges generated by the photosemiconductor film.

23. A method of disposing a plurality of spaced apart linear bodies on a predetermined workpiece so as to be parallel to each other, comprising the steps of:

supplying the plurality of linear bodies from a storage means that stores the linear bodies arranged parallel to each other;

simultaneously gripping with gripping means the plurality of linear bodies arranged parallel to each other at portions thereof which are in the vicinity of leading end portions thereof;

simultaneously drawing the plurality of gripped linear bodies from a first end portion to a second end portion of the workpiece;

simultaneously urging the plurality of linear bodies at portions thereof located between a portion of the workpiece in the vicinity of the first end portion thereof and a portion of the workpiece in the vicinity of the second end portion thereof against the workpiece, and supplying an adhesive to the plurality of linear bodies and the workpiece by adhesive supplying means, thereby adhering together the plurality of linear bodies and the workpiece;

simultaneously cutting portions of the plurality of linear bodies located at the first and second end portions of the workpiece, the cutting step being performed simultaneously with said adhering step; and withdrawing the adhesive supplying means and the urging means from the workpiece.

24. The method according to claim 23, further comprising, before said adhering step, the step of simultaneously gripping a first end portion side of each of the linear bodies with a second gripping means located in the vicinity of the first end portion of the workpiece.

25. The method according to claim 24, further comprising, after said releasing step, the step of returning the gripping means from the second end portion to the first end portion of the workpiece, and transferring the linear bodies from the second gripping means to the gripping means.

26. The method according to claim 23, further comprising the step of simultaneously removing slack in the plurality of linear bodies before the plurality of linear bodies are drawn to the second end portion of the workpiece.

27. The method according to claim 23, wherein the work is a solar cell substrate having a surface coated with a photosemiconductor film, and the linear bodies are collector wires that collect charges generated by the photosemiconductor film.

* * * * *

UNITED STATES PATENT AND TRADEMARK OFFICE
CERTIFICATE OF CORRECTION

PATENT NO. : 5,735,967

DATED : April 7, 1998

INVENTOR(S) : Yakou et al.

It is certified that error appears in the above-identified patent and that said Letters Patent is hereby corrected as shown below:

COLUMN 1:

Line 26, "been" should be deleted.

COLUMN 10:

Line 21, "tape" should read --tapes--.

COLUMN 14:

Line 41, "s" should read --as--.

COLUMN 20:

Line 27, "late." should read --plate.--.

COLUMN 21:

Line 64, "discharged" should read --discarded--.

COLUMN 29:

Line 22, "references" should read --reference--.

UNITED STATES PATENT AND TRADEMARK OFFICE
CERTIFICATE OF CORRECTION

PATENT NO. : 5,735,967

DATED : April 7, 1998

INVENTOR(S) : Yakou et al.

It is certified that error appears in the above-identified patent and that said Letters Patent is hereby corrected as shown below:

COLUMN 30:

Line 5, "later." should read --latter.--.

COLUMN 31:

Line 64, "step" should read --drawing step--.

COLUMN 32:

Line 15, "am" should read --an--.

Signed and Sealed this

Twenty-second Day of December, 1998

BRUCE LEHMAN

Attest:

Attesting Officer

Commissioner of Patents and Trademarks